(12) United States Patent
Uzoh

(10) Patent No.: US 12,424,584 B2
(45) Date of Patent: Sep. 23, 2025

(54) DIRECT BONDING METHODS AND STRUCTURES

(71) Applicant: ADEIA SEMICONDUCTOR BONDING TECHNOLOGIES INC., San Jose, CA (US)

(72) Inventor: Cyprian Emeka Uzoh, San Jose, CA (US)

(73) Assignee: ADEIA SEMICONDUCTOR BONDING TECHNOLOGIES INC., San Jose, CA (US)

(*) Notice: Subject to any disclaimer, the term of this patent is extended or adjusted under 35 U.S.C. 154(b) by 348 days.

(21) Appl. No.: 17/452,753

(22) Filed: Oct. 28, 2021

(65) Prior Publication Data
US 2022/0139867 A1 May 5, 2022

Related U.S. Application Data

(60) Provisional application No. 63/107,228, filed on Oct. 29, 2020.

(51) Int. Cl.
H01L 23/00 (2006.01)

(52) U.S. Cl.
CPC .... H01L 24/80 (2013.01); *H01L 2224/80019* (2013.01); *H01L 2224/80895* (2013.01); *H01L 2224/80896* (2013.01)

(58) Field of Classification Search
None
See application file for complete search history.

(56) References Cited

U.S. PATENT DOCUMENTS 3,423,823 A 1/1969 Ansley
3,488,834 A 1/1970 Baird
(Continued)

FOREIGN PATENT DOCUMENTS

CA 2 399 282 A1 8/2001
CN 113451246 A * 9/2021 ....... H01L 21/76898
(Continued)

OTHER PUBLICATIONS

Yusoh et al. "Effect of tetramethylammonium hydroxide/isopropyl alcohol wet etching on geometry and surface roughness of silicon nanowires fabricated by AFM Lithography", pp. 1461-1470, Oct. 17, 2016 (Year: 2016).*
(Continued)

*Primary Examiner* — Telly D Green
(74) *Attorney, Agent, or Firm* — Knobbe, Martens, Olson & Bear, LLP

(57) ABSTRACT

A bonding method can include polishing a first bonding layer of a first element for direct bonding, the first bonding layer comprises a first conductive pad and a first non-conductive bonding region. After the polishing, a last chemical treatment can be performed on the polished first bonding layer. After performing the last chemical treatment, the first bonding layer of the first element can be directly bonded to a second bonding layer of a second element without an intervening adhesive, including directly bonding the first conductive pad to a second conductive pad of the second bonding layer and directly bonding the first non-conductive bonding region to a second nonconductive bonding region of the second bonding layer. No treatment or rinse is performed on the first bonding layer between performing the last chemical treatment and directly bonding.

33 Claims, 8 Drawing Sheets

(56) References Cited

U.S. PATENT DOCUMENTS

| | | |
|---|---|---|
| 3,508,980 A | 4/1970 | Jackson, Jr. et al. |
| 3,534,467 A | 10/1970 | Sachs et al. |
| 3,579,391 A | 5/1971 | Buie |
| 3,587,166 A | 6/1971 | Alexander et al. |
| 3,602,981 A | 9/1971 | Kooi |
| 3,607,466 A | 9/1971 | Miyazaki |
| 3,640,807 A | 2/1972 | Van Dijk |
| 3,647,581 A | 3/1972 | Mash |
| 3,888,708 A | 6/1975 | Wise et al. |
| 4,416,054 A | 11/1983 | Thomas et al. |
| 4,500,905 A | 2/1985 | Shibata |
| 4,612,083 A | 9/1986 | Yasumoto et al. |
| 4,617,160 A | 10/1986 | Belanger et al. |
| 4,649,630 A | 3/1987 | Boland et al. |
| 4,700,466 A | 10/1987 | Nakagawa et al. |
| 4,754,544 A | 7/1988 | Hanak |
| 4,829,018 A | 5/1989 | Wahlstrom |
| 4,935,386 A | 6/1990 | Nakagawa et al. |
| 4,962,879 A | 10/1990 | Goesele et al. |
| 4,963,505 A | 10/1990 | Fujii et al. |
| 4,970,175 A | 11/1990 | Haisma et al. |
| 4,971,925 A | 11/1990 | Alexander et al. |
| 4,978,421 A | 12/1990 | Bassous et al. |
| 4,983,251 A | 1/1991 | Haisma et al. |
| 4,992,847 A | 2/1991 | Tuckerman |
| 5,007,071 A | 4/1991 | Nakano et al. |
| 5,024,723 A | 6/1991 | Goesele et al. |
| 5,034,343 A | 7/1991 | Rouse et al. |
| 5,070,026 A | 12/1991 | Greenwald et al. |
| 5,071,792 A | 12/1991 | Van Vonno et al. |
| 5,081,061 A | 1/1992 | Rouse et al. |
| 5,087,585 A | 2/1992 | Hayashi |
| 5,089,431 A | 2/1992 | Slatter et al. |
| 5,121,706 A | 6/1992 | Nichols et al. |
| 5,162,251 A | 11/1992 | Poole et al. |
| 5,183,783 A | 2/1993 | Ohta et al. |
| 5,196,375 A | 3/1993 | Hoshi |
| 5,234,860 A | 8/1993 | Gluck |
| 5,236,118 A | 8/1993 | Bower et al. |
| 5,238,875 A | 8/1993 | Ogino |
| 5,264,113 A | 11/1993 | Bartak et al. |
| 5,266,412 A | 11/1993 | Bartak et al. |
| 5,266,511 A | 11/1993 | Takao |
| 5,266,824 A | 11/1993 | Abe et al. |
| 5,270,259 A | 12/1993 | Ito et al. |
| 5,270,261 A | 12/1993 | Bertin et al. |
| 5,272,104 A | 12/1993 | Schrantz et al. |
| 5,321,301 A | 6/1994 | Sato et al. |
| 5,324,365 A | 6/1994 | Niwa |
| 5,324,687 A | 6/1994 | Wojnarowski |
| 5,344,524 A | 9/1994 | Sharma et al. |
| 5,354,695 A | 10/1994 | Leedy |
| 5,362,659 A | 11/1994 | Cartagena |
| 5,362,667 A | 11/1994 | Linn et al. |
| 5,376,579 A | 12/1994 | Annamalai |
| 5,380,681 A | 1/1995 | Hsu |
| 5,383,993 A | 1/1995 | Katada et al. |
| 5,394,303 A | 2/1995 | Yamaji |
| 5,407,506 A | 4/1995 | Goetz et al. |
| 5,407,856 A | 4/1995 | Quenzer et al. |
| 5,413,952 A | 5/1995 | Pages et al. |
| 5,413,955 A | 5/1995 | Lee et al. |
| 5,420,043 A | 5/1995 | Niwa |
| 5,420,449 A | 5/1995 | Oji |
| 5,421,953 A | 6/1995 | Nagakubo et al. |
| 5,422,302 A | 6/1995 | Yonehara et al. |
| 5,427,638 A | 6/1995 | Goetz et al. |
| 5,432,729 A | 7/1995 | Carson et al. |
| 5,441,591 A | 8/1995 | Imthurn et al. |
| 5,441,911 A | 8/1995 | Malhi |
| 5,451,547 A | 9/1995 | Himi et al. |
| 5,459,104 A | 10/1995 | Sakai |
| 5,460,659 A | 10/1995 | Krut |
| 5,485,540 A | 1/1996 | Eda |
| 5,489,554 A | 2/1996 | Gates |
| 5,497,033 A | 3/1996 | Filion et al. |
| 5,503,704 A | 4/1996 | Bower et al. |
| 5,514,235 A | 5/1996 | Mitani et al. |
| 5,516,727 A | 5/1996 | Broom |
| 5,517,057 A | 5/1996 | Beilstein et al. |
| 5,517,754 A | 5/1996 | Beilstein et al. |
| 5,523,602 A | 6/1996 | Horiuchi et al. |
| 5,534,465 A | 7/1996 | Frye et al. |
| 5,543,648 A | 8/1996 | Miyawaki |
| 5,546,494 A | 8/1996 | Eda |
| 5,547,896 A | 8/1996 | Linn et al. |
| 5,548,178 A | 8/1996 | Eda et al. |
| 5,561,303 A | 10/1996 | Schrantz et al. |
| 5,563,084 A | 10/1996 | Ramm et al. |
| 5,565,384 A | 10/1996 | Havemann |
| 5,567,657 A | 10/1996 | Wojnarowski et al. |
| 5,569,620 A | 10/1996 | Linn et al. |
| 5,578,501 A | 11/1996 | Niwa |
| 5,580,407 A | 12/1996 | Haisma et al. |
| 5,591,678 A | 1/1997 | Bendik et al. |
| 5,627,106 A | 5/1997 | Hsu |
| 5,647,932 A | 7/1997 | Taguchi et al. |
| 5,650,353 A | 7/1997 | Yoshizawa et al. |
| 5,652,436 A | 7/1997 | Stoner et al. |
| 5,653,019 A | 8/1997 | Bernhardt et al. |
| 5,661,316 A | 8/1997 | Kish, Jr. et al. |
| 5,661,901 A | 9/1997 | King |
| 5,666,706 A | 9/1997 | Tomita et al. |
| 5,668,057 A | 9/1997 | Eda et al. |
| 5,672,240 A | 9/1997 | Stoner et al. |
| 5,673,478 A | 10/1997 | Beene et al. |
| 5,698,471 A | 12/1997 | Namba et al. |
| 5,728,624 A | 3/1998 | Linn et al. |
| 5,741,733 A | 4/1998 | Bertagnolli et al. |
| 5,747,857 A | 5/1998 | Eda et al. |
| 5,753,529 A | 5/1998 | Chang et al. |
| 5,753,536 A | 5/1998 | Sugiyama et al. |
| 5,753,975 A | 5/1998 | Matsuno |
| 5,755,914 A | 5/1998 | Yonehara |
| 5,759,753 A | 6/1998 | Namba et al. |
| 5,760,478 A | 6/1998 | Bozso et al. |
| 5,763,318 A | 6/1998 | Bertin et al. |
| 5,766,984 A | 6/1998 | Ramm et al. |
| 5,771,555 A | 6/1998 | Eda et al. |
| 5,783,477 A | 7/1998 | Kish, Jr. et al. |
| 5,785,874 A | 7/1998 | Eda et al. |
| 5,793,115 A | 8/1998 | Zavracky et al. |
| 5,804,086 A | 9/1998 | Bruel |
| 5,807,783 A | 9/1998 | Gaul et al. |
| 5,821,665 A | 10/1998 | Onishi et al. |
| 5,841,197 A | 11/1998 | Adamic, Jr. |
| 5,849,627 A | 12/1998 | Linn et al. |
| 5,851,894 A | 12/1998 | Ramm |
| 5,858,876 A | 1/1999 | Chew |
| 5,866,942 A | 2/1999 | Suzuki et al. |
| 5,869,354 A | 2/1999 | Leedy |
| 5,872,025 A | 2/1999 | Cronin et al. |
| 5,876,497 A | 3/1999 | Atoji |
| 5,877,034 A | 3/1999 | Ramm et al. |
| 5,877,070 A | 3/1999 | Goesele et al. |
| 5,877,516 A | 3/1999 | Mermagen et al. |
| 5,880,010 A | 3/1999 | Davidson |
| 5,889,302 A | 3/1999 | Liu |
| 5,902,118 A | 5/1999 | Hubner |
| 5,903,018 A | 5/1999 | Shimawaki |
| 5,904,860 A | 5/1999 | Nagakubo et al. |
| 5,910,699 A | 6/1999 | Namba et al. |
| 5,915,167 A | 6/1999 | Leedy |
| 5,915,193 A | 6/1999 | Tong et al. |
| 5,920,142 A | 7/1999 | Onishi et al. |
| 5,936,280 A | 8/1999 | Liu |
| 5,966,622 A | 10/1999 | Levine et al. |
| 5,980,770 A | 11/1999 | Ramachandran et al. |
| 5,982,010 A | 11/1999 | Namba et al. |
| 5,985,412 A | 11/1999 | Gosele |
| 5,990,472 A | 11/1999 | Rinne |
| 5,990,562 A | 11/1999 | Vallett |
| 5,991,989 A | 11/1999 | Onishi et al. |
| 6,004,865 A | 12/1999 | Horiuchi et al. |

(56) References Cited

U.S. PATENT DOCUMENTS

| | | |
|---|---|---|
| 6,004,866 A | 12/1999 | Nakano et al. |
| 6,018,211 A | 1/2000 | Kanaboshi et al. |
| 6,048,752 A | 4/2000 | Linderman |
| 6,054,369 A | 4/2000 | Neilson et al. |
| 6,054,371 A | 4/2000 | Tsuchiaki et al. |
| 6,071,761 A | 6/2000 | Jacobs |
| 6,080,487 A | 6/2000 | Coggio et al. |
| 6,080,640 A | 6/2000 | Gardner et al. |
| 6,087,719 A | 7/2000 | Tsunashima |
| 6,087,760 A | 7/2000 | Yamaguchi et al. |
| 6,097,096 A | 8/2000 | Gardner et al. |
| 6,103,009 A | 8/2000 | Atoji |
| 6,106,653 A | 8/2000 | Polizzotti et al. |
| 6,120,917 A | 9/2000 | Eda |
| 6,133,640 A | 10/2000 | Leedy |
| 6,136,691 A | 10/2000 | Chen |
| 6,143,628 A | 11/2000 | Sato et al. |
| 6,146,992 A | 11/2000 | Lauterbach et al. |
| 6,153,445 A | 11/2000 | Yamazaki et al. |
| 6,153,495 A | 11/2000 | Kub et al. |
| 6,154,940 A | 12/2000 | Onishi et al. |
| 6,156,624 A | 12/2000 | Yamagata et al. |
| 6,159,767 A | 12/2000 | Eichelberger |
| 6,165,817 A | 12/2000 | Akram et al. |
| 6,180,496 B1 | 1/2001 | Farrens et al. |
| 6,190,778 B1 | 2/2001 | Batz-Sohn et al. |
| 6,194,323 B1 | 2/2001 | Downey et al. |
| 6,197,663 B1 | 3/2001 | Chandross et al. |
| 6,198,159 B1 | 3/2001 | Hosoma et al. |
| 6,204,079 B1 | 3/2001 | Aspar et al. |
| 6,236,141 B1 | 5/2001 | Sato et al. |
| 6,242,324 B1 | 6/2001 | Kub et al. |
| 6,246,068 B1 | 6/2001 | Sato et al. |
| 6,255,731 B1 | 7/2001 | Ohmi et al. |
| 6,255,899 B1 | 7/2001 | Bertin et al. |
| 6,270,202 B1 | 8/2001 | Namba et al. |
| 6,274,892 B1 | 8/2001 | Kub et al. |
| 6,278,174 B1 | 8/2001 | Havemann et al. |
| 6,313,012 B1 | 11/2001 | Horiuchi et al. |
| 6,316,332 B1 | 11/2001 | Lo et al. |
| 6,323,108 B1 | 11/2001 | Kub et al. |
| 6,328,796 B1 | 12/2001 | Kub et al. |
| 6,328,841 B1 | 12/2001 | Klumpp et al. |
| 6,348,706 B1 | 2/2002 | Sandhu |
| 6,423,640 B1 | 7/2002 | Lee et al. |
| 6,440,878 B1 | 8/2002 | Yang et al. |
| 6,448,174 B1 | 9/2002 | Ramm |
| 6,465,892 B1 | 10/2002 | Suga |
| 6,475,072 B1 | 11/2002 | Canaperi et al. |
| 6,497,763 B2 | 12/2002 | Kub et al. |
| 6,562,647 B2 | 5/2003 | Zandman et al. |
| 6,563,133 B1 | 5/2003 | Tong |
| 6,563,224 B2 | 5/2003 | Leedy |
| 6,613,678 B1 | 9/2003 | Sakaguchi et al. |
| 6,627,531 B2 | 9/2003 | Enquist |
| 6,645,828 B1 | 11/2003 | Farrens et al. |
| 6,774,461 B2 | 8/2004 | Yeh et al. |
| 6,864,585 B2 | 3/2005 | Enquist |
| 6,887,769 B2 | 5/2005 | Kellar et al. |
| 6,902,987 B1 | 6/2005 | Tong et al. |
| 6,905,557 B2 | 6/2005 | Enquist |
| 6,908,027 B2 | 6/2005 | Tolchinsky et al. |
| 6,908,832 B2 | 6/2005 | Farrens et al. |
| 6,909,146 B1 | 6/2005 | Linn et al. |
| 6,984,571 B1 * | 1/2006 | Enquist .................. H01L 24/94 |
| | | 257/E21.705 |
| 6,989,314 B2 | 1/2006 | Rayssac et al. |
| 7,037,755 B2 | 5/2006 | Enquist |
| 7,041,178 B2 | 5/2006 | Tong et al. |
| 7,045,453 B2 | 5/2006 | Canaperi et al. |
| 7,105,980 B2 | 9/2006 | Abbott et al. |
| 7,109,092 B2 | 9/2006 | Tong |
| 7,119,400 B2 | 10/2006 | Burden |
| 7,126,212 B2 | 10/2006 | Enquist et al. |
| 7,193,423 B1 | 3/2007 | Dalton et al. |
| 7,335,572 B2 | 2/2008 | Tong et al. |
| 7,335,996 B2 | 2/2008 | Tong |
| 7,358,152 B2 | 4/2008 | Kub et al. |
| 7,387,944 B2 | 6/2008 | Tong et al. |
| 7,553,744 B2 | 6/2009 | Tong et al. |
| 7,750,488 B2 | 7/2010 | Patti et al. |
| 7,803,693 B2 | 9/2010 | Trezza |
| 7,807,549 B2 | 10/2010 | Tong et al. |
| 7,871,898 B2 | 1/2011 | Tong et al. |
| 8,053,329 B2 | 11/2011 | Tong et al. |
| 8,183,127 B2 | 5/2012 | Patti et al. |
| 8,349,635 B1 | 1/2013 | Gan et al. |
| 8,377,798 B2 | 2/2013 | Peng et al. |
| 8,441,131 B2 | 5/2013 | Ryan |
| 8,476,165 B2 | 7/2013 | Trickett et al. |
| 8,482,132 B2 | 7/2013 | Yang et al. |
| 8,501,537 B2 | 8/2013 | Sadaka et al. |
| 8,505,197 B2 * | 8/2013 | Blanchard .............. H01L 21/304 |
| | | 438/455 |
| 8,524,533 B2 | 9/2013 | Tong et al. |
| 8,620,164 B2 | 12/2013 | Heck et al. |
| 8,647,987 B2 | 2/2014 | Yang et al. |
| 8,697,493 B2 | 4/2014 | Sadaka |
| 8,716,105 B2 | 5/2014 | Sadaka et al. |
| 8,802,538 B1 | 8/2014 | Liu |
| 8,809,123 B2 | 8/2014 | Liu et al. |
| 8,841,002 B2 | 9/2014 | Tong |
| 8,988,299 B2 | 3/2015 | Kam et al. |
| 9,093,350 B2 | 7/2015 | Endo et al. |
| 9,142,517 B2 | 9/2015 | Liu et al. |
| 9,142,532 B2 | 9/2015 | Suga et al. |
| 9,171,756 B2 | 10/2015 | Enquist et al. |
| 9,184,125 B2 | 11/2015 | Enquist et al. |
| 9,224,704 B2 | 12/2015 | Landru |
| 9,230,941 B2 | 1/2016 | Chen et al. |
| 9,257,399 B2 | 2/2016 | Kuang et al. |
| 9,299,736 B2 | 3/2016 | Chen et al. |
| 9,312,229 B2 | 4/2016 | Chen et al. |
| 9,331,149 B2 | 5/2016 | Tong et al. |
| 9,337,235 B2 | 5/2016 | Chen et al. |
| 9,368,866 B2 | 6/2016 | Yu |
| 9,385,024 B2 | 7/2016 | Tong et al. |
| 9,391,143 B2 | 7/2016 | Tong et al. |
| 9,394,161 B2 | 7/2016 | Cheng et al. |
| 9,431,368 B2 | 8/2016 | Enquist et al. |
| 9,437,572 B2 | 9/2016 | Chen et al. |
| 9,443,796 B2 | 9/2016 | Chou et al. |
| 9,461,007 B2 | 10/2016 | Chun et al. |
| 9,496,239 B1 | 11/2016 | Edelstein et al. |
| 9,536,848 B2 | 1/2017 | England et al. |
| 9,559,081 B1 | 1/2017 | Lai et al. |
| 9,620,481 B2 | 4/2017 | Edelstein et al. |
| 9,656,852 B2 | 5/2017 | Cheng et al. |
| 9,723,716 B2 | 8/2017 | Meinhold |
| 9,728,521 B2 | 8/2017 | Tsai et al. |
| 9,741,620 B2 | 8/2017 | Uzoh et al. |
| 9,799,587 B2 | 10/2017 | Fujii et al. |
| 9,852,988 B2 | 12/2017 | Enquist et al. |
| 9,881,882 B2 | 1/2018 | Hsu et al. |
| 9,893,004 B2 | 2/2018 | Yazdani |
| 9,899,442 B2 | 2/2018 | Katkar |
| 9,929,050 B2 | 3/2018 | Lin |
| 9,941,241 B2 | 4/2018 | Edelstein et al. |
| 9,941,243 B2 | 4/2018 | Kim et al. |
| 9,953,941 B2 | 4/2018 | Enquist |
| 9,960,142 B2 | 5/2018 | Chen et al. |
| 10,002,844 B1 | 6/2018 | Wang et al. |
| 10,026,605 B2 | 7/2018 | Doub et al. |
| 10,075,657 B2 | 9/2018 | Fahim et al. |
| 10,204,893 B2 | 2/2019 | Uzoh et al. |
| 10,269,756 B2 | 4/2019 | Uzoh |
| 10,276,619 B2 | 4/2019 | Kao et al. |
| 10,276,909 B2 | 4/2019 | Huang et al. |
| 10,418,277 B2 | 9/2019 | Cheng et al. |
| 10,434,749 B2 * | 10/2019 | Tong ..................... B32B 7/04 |
| 10,446,456 B2 | 10/2019 | Shen et al. |
| 10,446,487 B2 | 10/2019 | Huang et al. |
| 10,446,532 B2 | 10/2019 | Uzoh et al. |
| 10,508,030 B2 | 12/2019 | Katkar et al. |

(56) References Cited

U.S. PATENT DOCUMENTS

| | | |
|---|---|---|
| 10,522,499 B2 | 12/2019 | Enquist et al. |
| 10,707,087 B2 | 7/2020 | Uzoh et al. |
| 10,727,219 B2 | 7/2020 | Uzoh et al. |
| 10,784,191 B2 | 9/2020 | Huang et al. |
| 10,790,262 B2 | 9/2020 | Uzoh et al. |
| 10,840,205 B2 | 11/2020 | Fountain, Jr. et al. |
| 10,854,578 B2 | 12/2020 | Morein |
| 10,879,212 B2 | 12/2020 | Uzoh et al. |
| 10,886,177 B2 | 1/2021 | DeLaCruz et al. |
| 10,892,246 B2 | 1/2021 | Uzoh |
| 10,923,408 B2 | 2/2021 | Huang et al. |
| 10,923,413 B2 | 2/2021 | DeLaCruz |
| 10,950,547 B2 | 3/2021 | Mohammed et al. |
| 10,964,664 B2 | 3/2021 | Mandalapu et al. |
| 10,985,133 B2 | 4/2021 | Uzoh |
| 10,991,804 B2 | 4/2021 | DeLaCruz et al. |
| 10,998,292 B2 | 5/2021 | Lee et al. |
| 11,004,757 B2 | 5/2021 | Katkar et al. |
| 11,011,494 B2 | 5/2021 | Gao et al. |
| 11,011,503 B2 | 5/2021 | Wang et al. |
| 11,031,285 B2* | 6/2021 | Katkar ............ H01L 24/03 |
| 11,037,919 B2 | 6/2021 | Uzoh et al. |
| 11,056,348 B2 | 7/2021 | Theil |
| 11,069,734 B2 | 7/2021 | Katkar |
| 11,088,099 B2 | 8/2021 | Katkar et al. |
| 11,127,738 B2 | 9/2021 | DeLaCruz et al. |
| 11,158,573 B2 | 10/2021 | Uzoh et al. |
| 11,158,606 B2 | 10/2021 | Gao et al. |
| 11,169,326 B2 | 11/2021 | Huang et al. |
| 11,171,117 B2 | 11/2021 | Gao et al. |
| 11,176,450 B2 | 11/2021 | Teig et al. |
| 11,195,748 B2 | 12/2021 | Uzoh et al. |
| 11,205,625 B2 | 12/2021 | DeLaCruz et al. |
| 11,256,004 B2 | 2/2022 | Haba et al. |
| 11,264,357 B1 | 3/2022 | DeLaCruz et al. |
| 11,276,676 B2 | 3/2022 | Enquist et al. |
| 11,296,044 B2 | 4/2022 | Gao et al. |
| 11,329,034 B2 | 5/2022 | Tao et al. |
| 11,348,898 B2 | 5/2022 | DeLaCruz et al. |
| 11,355,443 B2 | 6/2022 | Huang et al. |
| 11,367,652 B2 | 6/2022 | Uzoh et al. |
| 11,760,059 B2 | 9/2023 | Tong |
| 2001/0016382 A1 | 8/2001 | Song et al. |
| 2002/0096760 A1 | 7/2002 | Simelgor et al. |
| 2002/0181827 A1 | 12/2002 | Johnson et al. |
| 2003/0020104 A1 | 1/2003 | Talin et al. |
| 2003/0057423 A1 | 3/2003 | Shimoda et al. |
| 2004/0009649 A1 | 1/2004 | Kub et al. |
| 2004/0084414 A1 | 5/2004 | Sakai et al. |
| 2004/0126993 A1 | 7/2004 | Chan et al. |
| 2004/0157407 A1 | 8/2004 | Tong et al. |
| 2004/0226656 A1 | 11/2004 | Walsh et al. |
| 2004/0235266 A1* | 11/2004 | Tong ............... B32B 7/04 438/455 |
| 2005/0110159 A1 | 5/2005 | Oh et al. |
| 2006/0057945 A1 | 3/2006 | Hsu et al. |
| 2006/0292744 A1 | 12/2006 | Enquist et al. |
| 2007/0096294 A1 | 5/2007 | Ikeda et al. |
| 2007/0111386 A1 | 5/2007 | Kim et al. |
| 2007/0222048 A1 | 9/2007 | Huang |
| 2007/0295456 A1 | 12/2007 | Gudeman et al. |
| 2008/0061418 A1 | 3/2008 | Enquist et al. |
| 2008/0061419 A1 | 3/2008 | Enquist et al. |
| 2008/0093747 A1 | 4/2008 | Enquist et al. |
| 2011/0067803 A1 | 3/2011 | Tong et al. |
| 2011/0290552 A1 | 12/2011 | Palmateer et al. |
| 2012/0077329 A1* | 3/2012 | Broekaart ............ H01L 21/187 438/455 |
| 2012/0212384 A1 | 8/2012 | Kam et al. |
| 2013/0137245 A1 | 5/2013 | Robert |
| 2014/0175655 A1 | 6/2014 | Chen et al. |
| 2014/0225795 A1 | 8/2014 | Yu |
| 2015/0064498 A1 | 3/2015 | Tong |
| 2016/0190103 A1* | 6/2016 | Kabe ............... H01L 23/564 257/777 |
| 2016/0343682 A1 | 11/2016 | Kawasaki |
| 2017/0062366 A1 | 3/2017 | Enquist |
| 2017/0170132 A1 | 6/2017 | Enquist et al. |
| 2017/0179029 A1 | 6/2017 | Enquist et al. |
| 2017/0194271 A1 | 7/2017 | Hsu et al. |
| 2017/0200711 A1 | 7/2017 | Uzoh et al. |
| 2017/0338214 A1 | 11/2017 | Uzoh et al. |
| 2018/0096931 A1 | 4/2018 | Huang et al. |
| 2018/0174995 A1 | 6/2018 | Wang et al. |
| 2018/0175012 A1 | 6/2018 | Wu et al. |
| 2018/0182639 A1* | 6/2018 | Uzoh ............... H01L 21/6835 |
| 2018/0182666 A1 | 6/2018 | Uzoh et al. |
| 2018/0190580 A1 | 7/2018 | Haba et al. |
| 2018/0190583 A1 | 7/2018 | DeLaCruz et al. |
| 2018/0191047 A1 | 7/2018 | Huang et al. |
| 2018/0219038 A1 | 8/2018 | Gambino et al. |
| 2018/0226375 A1 | 8/2018 | Enquist et al. |
| 2018/0273377 A1 | 9/2018 | Katkar et al. |
| 2018/0286805 A1 | 10/2018 | Huang et al. |
| 2018/0323177 A1 | 11/2018 | Yu et al. |
| 2018/0323227 A1 | 11/2018 | Zhang et al. |
| 2018/0331066 A1 | 11/2018 | Uzoh et al. |
| 2019/0096741 A1 | 3/2019 | Uzoh et al. |
| 2019/0096842 A1 | 3/2019 | Fountain, Jr. et al. |
| 2019/0109042 A1 | 4/2019 | Katkar et al. |
| 2019/0115247 A1 | 4/2019 | Tong et al. |
| 2019/0115277 A1 | 4/2019 | Yu et al. |
| 2019/0131277 A1 | 5/2019 | Yang et al. |
| 2019/0198407 A1 | 6/2019 | Huang et al. |
| 2019/0198409 A1 | 6/2019 | Katkar et al. |
| 2019/0252364 A1* | 8/2019 | Uzoh ............... H01L 24/75 |
| 2019/0265411 A1 | 8/2019 | Huang et al. |
| 2019/0333550 A1 | 10/2019 | Fisch |
| 2019/0344533 A1* | 11/2019 | Tong ............... H01L 24/29 |
| 2019/0344534 A1 | 11/2019 | Tong |
| 2019/0348336 A1 | 11/2019 | Katkar et al. |
| 2019/0371761 A1* | 12/2019 | Uzoh ............... H01L 24/97 |
| 2019/0385935 A1 | 12/2019 | Gao et al. |
| 2019/0385966 A1 | 12/2019 | Gao et al. |
| 2020/0006266 A1* | 1/2020 | Chen ............... H01L 23/5283 |
| 2020/0013637 A1 | 1/2020 | Haba |
| 2020/0013765 A1 | 1/2020 | Fountain, Jr. et al. |
| 2020/0035641 A1 | 1/2020 | Fountain, Jr. et al. |
| 2020/0051945 A1* | 2/2020 | Pan ............... H01L 25/0657 |
| 2020/0075520 A1 | 3/2020 | Gao et al. |
| 2020/0075534 A1 | 3/2020 | Gao et al. |
| 2020/0075553 A1 | 3/2020 | DeLaCruz et al. |
| 2020/0118973 A1 | 4/2020 | Wang et al. |
| 2020/0126906 A1 | 4/2020 | Uzoh et al. |
| 2020/0126945 A1* | 4/2020 | Wang ............... H01L 23/53228 |
| 2020/0194396 A1 | 6/2020 | Uzoh |
| 2020/0227367 A1 | 7/2020 | Haba et al. |
| 2020/0243380 A1 | 7/2020 | Uzoh et al. |
| 2020/0279821 A1 | 9/2020 | Haba et al. |
| 2020/0294908 A1 | 9/2020 | Haba et al. |
| 2020/0328162 A1* | 10/2020 | Haba ............... H01L 24/83 |
| 2020/0328164 A1* | 10/2020 | DeLaCruz ............ H01L 22/34 |
| 2020/0328165 A1* | 10/2020 | DeLaCruz ............ H01L 24/05 |
| 2020/0335408 A1 | 10/2020 | Gao et al. |
| 2020/0371154 A1* | 11/2020 | DeLaCruz ......... G01R 31/2853 |
| 2020/0395321 A1* | 12/2020 | Katkar ............ H01L 23/552 |
| 2020/0411483 A1 | 12/2020 | Uzoh et al. |
| 2021/0098412 A1 | 4/2021 | Haba et al. |
| 2021/0118864 A1 | 4/2021 | DeLaCruz et al. |
| 2021/0143125 A1 | 5/2021 | DeLaCruz et al. |
| 2021/0175280 A1* | 6/2021 | Chae ............... H01L 33/44 |
| 2021/0181510 A1 | 6/2021 | Katkar et al. |
| 2021/0193603 A1 | 6/2021 | Katkar et al. |
| 2021/0193624 A1 | 6/2021 | DeLaCruz et al. |
| 2021/0193625 A1* | 6/2021 | Katkar ............ H01L 24/06 |
| 2021/0202567 A1* | 7/2021 | Kim ............... H01L 27/156 |
| 2021/0242152 A1* | 8/2021 | Fountain, Jr. ....... H01L 24/80 |
| 2021/0296282 A1* | 9/2021 | Gao ............... H01L 24/08 |
| 2021/0305202 A1 | 9/2021 | Uzoh et al. |
| 2021/0366820 A1 | 11/2021 | Uzoh |
| 2021/0407941 A1* | 12/2021 | Haba ............... H01L 24/80 |
| 2022/0077063 A1 | 3/2022 | Haba |
| 2022/0077087 A1 | 3/2022 | Haba |
| 2022/0139869 A1 | 5/2022 | Gao et al. |

(56) References Cited

U.S. PATENT DOCUMENTS

| | | |
|---|---|---|
| 2022/0208650 A1 | 6/2022 | Gao et al. |
| 2022/0208702 A1 | 6/2022 | Uzoh |
| 2022/0208723 A1 | 6/2022 | Katkar et al. |
| 2022/0246497 A1 | 8/2022 | Fountain, Jr. et al. |
| 2022/0285303 A1 | 9/2022 | Mirkarimi et al. |
| 2022/0319901 A1 | 10/2022 | Suwito et al. |
| 2022/0320035 A1 | 10/2022 | Uzoh et al. |
| 2022/0320036 A1 | 10/2022 | Gao et al. |
| 2023/0005850 A1 | 1/2023 | Fountain, Jr. |
| 2023/0019869 A1 | 1/2023 | Mirkarimi et al. |
| 2023/0036441 A1 | 2/2023 | Haba et al. |
| 2023/0067677 A1 | 3/2023 | Lee et al. |
| 2023/0069183 A1 | 3/2023 | Haba |
| 2023/0100032 A1 | 3/2023 | Haba et al. |
| 2023/0115122 A1 | 4/2023 | Uzoh et al. |
| 2023/0122531 A1 | 4/2023 | Uzoh |
| 2023/0123423 A1 | 4/2023 | Gao et al. |
| 2023/0125395 A1 | 4/2023 | Gao et al. |
| 2023/0130259 A1 | 4/2023 | Haba et al. |
| 2023/0132632 A1 | 5/2023 | Katkar et al. |
| 2023/0140107 A1 | 5/2023 | Uzoh et al. |
| 2023/0142680 A1 | 5/2023 | Guevara et al. |
| 2023/0154816 A1 | 5/2023 | Haba et al. |
| 2023/0154828 A1 | 5/2023 | Haba et al. |
| 2023/0187264 A1 | 6/2023 | Uzoh et al. |
| 2023/0187317 A1 | 6/2023 | Uzoh |
| 2023/0187412 A1 | 6/2023 | Gao et al. |
| 2023/0197453 A1 | 6/2023 | Fountain, Jr. et al. |
| 2023/0197496 A1 | 6/2023 | Theil |
| 2023/0197559 A1 | 6/2023 | Haba et al. |
| 2023/0197560 A1 | 6/2023 | Katkar et al. |
| 2023/0197655 A1 | 6/2023 | Theil et al. |
| 2023/0207402 A1 | 6/2023 | Fountain, Jr. et al. |
| 2023/0207437 A1 | 6/2023 | Haba |
| 2023/0207474 A1 | 6/2023 | Uzoh et al. |
| 2023/0207514 A1 | 6/2023 | Gao et al. |
| 2023/0215836 A1 | 7/2023 | Haba et al. |
| 2023/0245950 A1 | 8/2023 | Haba et al. |
| 2023/0268300 A1 | 8/2023 | Uzoh et al. |
| 2023/0299029 A1 | 9/2023 | Theil et al. |
| 2023/0343734 A1 | 10/2023 | Uzoh et al. |
| 2023/0360950 A1 | 11/2023 | Gao |
| 2023/0361074 A1 | 11/2023 | Uzoh et al. |
| 2023/0369136 A1 | 11/2023 | Uzoh et al. |
| 2023/0375613 A1 | 11/2023 | Haba et al. |
| 2024/0038702 A1 | 2/2024 | Uzoh |
| 2024/0055407 A1 | 2/2024 | Workman |
| 2024/0079376 A1 | 3/2024 | Suwito et al. |
| 2024/0105674 A1 | 3/2024 | Uzoh et al. |
| 2024/0170411 A1 | 5/2024 | Chang et al. |
| 2024/0186248 A1 | 6/2024 | Haba et al. |
| 2024/0186268 A1 | 6/2024 | Uzoh et al. |
| 2024/0186269 A1 | 6/2024 | Haba |
| 2024/0203917 A1 | 6/2024 | Katkar et al. |
| 2024/0213191 A1 | 6/2024 | Theil et al. |
| 2024/0213210 A1 | 6/2024 | Haba et al. |
| 2024/0217210 A1 | 7/2024 | Zhao et al. |
| 2024/0222239 A1 | 7/2024 | Gao et al. |
| 2024/0222315 A1 | 7/2024 | Uzoh |
| 2024/0222319 A1 | 7/2024 | Gao et al. |
| 2024/0266255 A1 | 8/2024 | Haba et al. |

FOREIGN PATENT DOCUMENTS

| | | | |
|---|---|---|---|
| EP | 1033162 A1 * | 9/2000 | ......... B01D 19/0031 |
| EP | 1 130 647 A2 | 9/2001 | |
| JP | 54-116888 | 9/1979 | |
| JP | 54-155770 | 12/1979 | |
| JP | 60-167439 | 8/1985 | |
| JP | 61-174661 | 8/1986 | |
| JP | 62-031138 | 2/1987 | |
| JP | 62-283655 | 12/1987 | |
| JP | 63-237408 | 10/1988 | |
| JP | 63-246841 | 10/1988 | |
| JP | 64-007548 | 1/1989 | |
| JP | 01-259546 | 10/1989 | |
| JP | 02-177435 | 7/1990 | |
| JP | 03-70155 | 3/1991 | |
| JP | 03-101128 | 4/1991 | |
| JP | 07-161705 | 6/1995 | |
| JP | H07-249749 | 9/1995 | |
| JP | 08-022987 | 1/1996 | |
| JP | H08-195334 | 7/1996 | |
| JP | H08-236695 | 9/1996 | |
| JP | 08-298260 | 11/1996 | |
| JP | 09-7908 | 1/1997 | |
| JP | 09-027604 | 1/1997 | |
| JP | 09-148321 | 6/1997 | |
| JP | 09-330925 | 12/1997 | |
| JP | 10-223495 | 8/1998 | |
| JP | 10-223636 | 8/1998 | |
| JP | 11-87203 | 3/1999 | |
| JP | 2000-223703 | 8/2000 | |
| JP | 2001-144273 | 5/2001 | |
| JP | 2013-033786 A | 2/2013 | |
| JP | 2018-160519 | 10/2018 | |
| KR | 2002-81328 | 10/2002 | |
| KR | 10-2015-0097798 | 8/2015 | |
| TW | 389965 B | 5/2000 | |
| TW | 200303846 A * | 9/2003 | ......... C09D 171/02 |
| WO | WO 96/13060 | 5/1996 | |
| WO | WO 98/13860 | 4/1998 | |
| WO | WO 01/61743 A1 | 8/2001 | |
| WO | WO 2005/043584 A2 | 5/2005 | |
| WO | WO 2006/100444 A1 | 9/2006 | |
| WO | WO 2017/151442 A1 | 9/2017 | |

OTHER PUBLICATIONS

International Search Report and Written Opinion mailed Feb. 21, 2022, International Application No. PCT/US2021/072096, 12 pages.
Ker, Ming-Dou et al., "Fully process-compatible layout design on bond pad to improve wire bond reliability in CMOS Ics," IEEE Transactions on Components and Packaging Technologies, Jun. 2002, vol. 25, No. 2, pp. 309-316.
Moriceau, H. et al., "Overview of recent direct wafer bonding advances and applications," Advances in Natural Sciences—Nanoscience and Nanotechnology, 2010, 11 pages.
Nakanishi, H. et al., "Studies on SiO2—SiO2 bonding with hydrofluoric acid. Room temperature and low stress bonding technique for MEMS," Sensors and Actuators, 2000, vol. 79, pp. 237-244.
Oberhammer, J. et al., "Sealing of adhesive bonded devices on wafer level," Sensors and Actuators A, 2004, vol. 110, No. 1-3, pp. 407-412, see pp. 407-412, and Figures 1(a)-1(I), 6 pages.
Plobi, A. et al., "Wafer direct bonding: tailoring adhesion between brittle materials," Materials Science and Engineering Review Journal, 1999, R25, 88 pages.
Abe et al., "Bonded SOI wafers with various substrates for IC fabrication," Proceedings of the Second International Symposium on Semiconductor Wafer Bonding: Science, Technology and Applications, The Electrochemical Society Proceedings, vol. 93-29 (1993), pp. 32-42.
Amirfeiz et al., "Formation of silicon structures by plasma activated wafer bonding," Electrochemical Society Proceedings: Semiconductor Wafer Bonding: Science, Technology, and Applications V, vol. 99-35, (1999), pp. 29-39.
Amirfeiz et al., "Formation of silicon structures by plasma-activated wafer bonding," Journal of The Electrochemical Society, 2000, vol. 147, No. 7, pp. 2693-2698.
Amirfeiz et al., "Formation of silicon structures by plasma activated wafer bonding," vol. 99-2, Abstract No. 963, 1999 Joint Int'l Meeting of the Electrochecm. Soc'y, Dec. 16, 1999.
Arnold, Emil, "Silicon-on-insulator devices for high voltage and power IC applications," Proceedings of the Second International Symposium on Semiconductor Wafer Bonding: Science, Technology and Applications, The Electrochemical Society Proceedings, vol. 93-29 (1993), pp. 161-175.
Beitman et al., "Bonded SOI in a bipolar IC without trench isolation," Proceedings of the Second International Symposium on

(56) References Cited

OTHER PUBLICATIONS

Semiconductor Wafer Bonding: Science, Technology and Applications, The Electrochemical Society Proceedings, vol. 93-29 (1993), pp. 144-151.
Bengtsson et al., "Low temperature bonding," International Conference on Compliant & Alternative Substrate Technology, Sep. 1999, p. 10.
Bengtsson, Stefan et al., "The Influence of Wafer Dimensions on the Contact Wave Velocity in Silicon Wafer Bonding," 69 Applied Physics Letters 3381 (1996).
Bertagnolli, E. et al., "Interchip Via Technology Three-Dimensional Metallization for Vertically Integrated Circuits," Electrochemical Society Proceedings, vol. 97-36, pp. 509-520 (2000).
Bollmann et al., "Three Dimensional Metallization for Vertically Integrated Circuits," 1997 Materials for Advanced Metallization MAM '97 Abstracts Booklet 94.
Booth, D.E. et al., "Backside Imaging CCD Using Bonded and Etched Back Silicon on Epoxy," 97-36 Electrochemical Society Proceedings 584 (1998).
Booth et al., "Full three dimensional microcircuit integration techniques using wafer bonding," Proceedings of the Second International Symposium on Semiconductor Wafer Bonding: Science, Technology and Applications, The Electrochemical Society Proceedings, vol. 93-29 (1993), pp. 293-302.
Bower, R.W. et al., "Aligned Wafer Bonding: A Key to Three Dimensional Microstructures," 20 J. Electronic Materials 383, 383 (1991).
Bower, Robert W. et al., "Design Considerations of a Digital Pressure Sensor Array," 1991 International Conference on SolidState Sensors and Actuators, 1991. Digest of Technical Papers, Transducers, '91 312.
Bower, Robert W. et al., "Low Temperature S3N4 Direct Bonding," 62 Applied Physics Letters 3485 (1993).
Brugger et al., "High-precision aligned silicon wafer bonding for a micromachined AFM sensor," Proceedings of the Second International Symposium on Semiconductor Wafer Bonding: Science, Technology and Applications, The Electrochemical Society Proceedings, vol. 93-29 (1993), pp. 363-372.
Burke, Barry E. et al., Soft-X-Ray CCD Imagers for AXAF, IEEE Transactions on Electron Devices, vol. 44, No. 10, Oct. 1997, pp. 1633-1642.
Cha et al., "Design considerations for wafer bonding of dissimilar materials," Proceedings of the Second International Symposium on Semiconductor Wafer Bonding: Science, Technology and Applications, The Electrochemical Society Proceedings, vol. 93-29 (1993), pp. 257-266.
Christel et al., "Silicon fusion bonding: An important tool for the design of micromechanical silicon devices," Proceedings of the Second International Symposium on Semiconductor Wafer Bonding: Science, Technology and Applications, The Electrochemical Society Proceedings, vol. 93-29 (1993), pp. 327-339.
Chu, P. et al., "Semiconductor Applications", in Handbook of Plasma Immersion Ion Implantation and Deposition, 2000, pp. 637-681.
Ciarlo, D., "High- and low-temperature bonding techniques for microstructures," Proceedings of the Second International Symposium on Semiconductor Wafer Bonding: Science, Technology and Applications, The Electrochemical Society Proceedings, vol. 93-29 (1993), pp. 313-326.
Decision—Request for Trail Granted, Inter Partes Review, U.S. Pat. No. 7,335,996, Case IPR2013-00154, dated Aug. 9, 2013, in 19 pages.
D'Agostino, Ricardo, "Plasma Etching of Si and SiO2 in SF6—O2 mixtures," 52(1) J. Appl. Phys. 162 (1981).
Desmond et al., "Low-Temperature Atmospheric Silicon-Silicon Wafer Bonding for Power Electronic Applications," 97-36 Electrochemical Society Proceedings 459 (1998).
Desmond et al., "The effects of process-induced defects on the chemical selectivity of highly-doped boron etchstops," Proceedings of the Second International Symposium on Semiconductor Wafer Bonding: Science, Technology and Applications, The Electrochemical Society Proceedings, vol. 93-29 (1993), pp. 423-432.
Duncan, T.M. et al., "Study of Fluorine in Silicate Glass With19 F Nuclear Magnetic Resonance Spectroscopy," J. Appl. Phys., Jul. 1, 1986, vol. 60, No. 1, pp. 130-136.
Eda et al., "Quartz crystal on silicon technique using direct bonding," Proceedings of the Second International Symposium on Semiconductor Wafer Bonding: Science, Technology and Applications, The Electrochemical Society Proceedings, vol. 93-29 (1993), pp. 373-381.
Eom, C. B. et al., "Fabrication of Double Sided YBa2Cu3O7 Thin Films on 2 Inch Diameter LaAlO3 Wafers by Direct Wafer Bonding," 7 IEEE Transactions on Applied Superconductivity 1244 (1997).
Esashi, "Complex micromechanical structures by low temperature bonding," Proceedings of the Second International Symposium on Semiconductor Wafer Bonding: Science, Technology and Applications, The Electrochemical Society Proceedings, vol. 93-29 (1993), pp. 348-362.
Farrens, S. N. et al., "A Kinetics Study of the Bond Strength of Direct Bonded Wafers," J. Electrochemical Society, Nov. 1994, vol. 141, No. 11, pp. 3225-3230.
Farrens et al., "Analysis of bond characteristics in Si direct-bonded materials," Proceedings of the Second International Symposium on Semiconductor Wafer Bonding: Science, Technology and Applications, The Electrochemical Society Proceedings, vol. 93-29 (1993), pp. 81-95.
Farrens et al., "Chemical free room temperature wafer to wafer direct bonding," J. Electrochem. Soc., The Electrochemical Society, Inc., Nov. 1995, vol. 142, No. 11. pp. 3949-3955.
Farrens et al., "Chemical free wafer bonding of silicon to glass and sapphire," Electrochemical Society Proceedings vol. 95-7, 1995, pp. 72-77.
Farrens et al., "Low temperature wafer bonding," Electromechanical Society Proceedings, 1997, vol. 97-36, pp. 425-436.
Feijóo et al., "BE-SOI with etch stop layers grown by RTCVD," Proceedings of the Second International Symposium on Semiconductor Wafer Bonding: Science, Technology and Applications, The Electrochemical Society Proceedings, vol. 93-29 (1993), pp. 267-279.
Feijoó, Diego et al., Silicon Wafer Bonding Studied by Infrared Absorption Spectroscopy, 65 Applied Physics Letters 2548, 2548 (1994).
Feindt et al., "A complementary bipolar process on bonded wafers," Proceedings of the Second International Symposium on Semiconductor Wafer Bonding: Science, Technology and Applications, The Electrochemical Society Proceedings, vol. 93-29 (1993), pp. 189-196.
Final Written Decision, Inter PartesReview, U.S. Pat. No. 7,335,996, Case IPR2013-00154, dated Nov. 21, 2013, in 3 pages.
First Office Action (English translation) mailed Oct. 6, 2015, issued in Japanese Patent Application No. 2012-107053, 7 pages.
Folta et al., "Low-temperature wafer bonding of surfaces using a reactive sputtered oxide," Proceedings of the Second International Symposium on Semiconductor Wafer Bonding: Science, Technology and Applications, The Electrochemical Society Proceedings, vol. 93-29 (1993), pp. 107-113.
Gan, Qing, "Surface activation enhanced low temperature silicon wafer bonding," Dissertation submitted in partial fulfillment of the requirements for the degree of Doctor of Philosophy, Department of Mechanical Engineering and Materials Science, Duke University, Aug. 4, 2000, 192 pages.
Garofalini, Stephen H., "Atomistic structure and dynamic behavior of silica surfaces," Proceedings of the Second International Symposium on Semiconductor Wafer Bonding: Science, Technology and Applications, The Electrochemical Society Proceedings, vol. 93-29 (1993), pp. 57-70.
Gassel et al., "SIMOX and wafer bonding: Combination of competitors complements one another," Proceedings of the Second International Symposium on Semiconductor Wafer Bonding: Science, Technology and Applications, The Electrochemical Society Proceedings, vol. 93-29 (1993), pp. 433-442.

(56) References Cited

OTHER PUBLICATIONS

Gösele, U. et al., "Fundamental Issues in Wafer Bonding", J. Vac. Sci. Technol. A 17(4), Jul./Aug., (1999), American Vacuum Society, pp. 1145-1152.
Gösele, U. et al., "History and Future of Semiconductor Wafer Bonding," 47-48 Solid State Phenomena 33 (1996).
Gösele, U. et al., "Semiconductor Wafer Bonding", Annu. Rev. Mater. Sci. 1998, vol. 28, pp. 215-241.
Gösele et al., "Semiconductor Wafer Bonding: A flexible approach to materials combinations in microelectronics; micromechanics and optoelectronics," IEEE, 1997, pp. 23-32.
Gösele et al., "Silicon layer transfer by wafer bonding," Proceedings of the Second International Symposium on Semiconductor Wafer Bonding: Science, Technology and Applications, The Electrochemical Society Proceedings, vol. 93-29 (1993), pp. 395-409.
Gösele, U. et al., "Wafer Bonding for Microsystems Technologies", Sensors and Actuators 74, 1999 Elsevier Science S.A, 1999, pp. 161-168.
Graf, D. et al., "Reaction of Water with Hydrofluoric Acid Treated Silicon (111) and (100) Surfaces," J. Vac. Sci. Technol., May/Jun. 1989, A7(3), pp. 808-813.
Gui et al., "The effect of surface roughness on direct wafer bonding,"15, 1999, vol. 85, No. 10, pp. 7448-7454.
Haisma, J. et al., "Silicon-on-insulator wafer bonding-wafer thinning technological evaluations," Jap. Journal-Appl. Phys., 1989, vol. 28, No. 8, pp. 1426-1443.
Harendt et al., "Bonded-wafer SOI smart power circuits in automotive applications," Proceedings of the Second International Symposium on Semiconductor Wafer Bonding: Science, Technology and Applications, The Electrochemical Society Proceedings, vol. 93-29 (1993), pp. 129-143.
Harendt, C. et al., "Vertical Polysilicon Interconnects by Aligned Wafer Bonding," Electrochemical Society Proceedings vol. 97-36, (1998), pp. 501-508.
Hayashi et al., "Fabrication of three-dimensional IC using "Cumulatively Bonded IC" (CUBIC) technology," 1990 Symp. VLSI Tech Dig., NEC Corp., Microelectronics Research Laboratories, pp. 95-96.
Henttinen, K. et al., "Mechanically Induced Si Layer Transfer in Hydrogen-Implanted Si Wafers," Applied Physics Letters, Apr. 24, 2000, vol. 76, No. 17, pp. 2370-2372.
Hobart, K.D. et al., "Fabrication of a Double-Side IGBT by Very Low Temperature Wafer Bonding," 1999 Proceedings of the 11th International Symposium on Power Semiconductor Devices and ICs 45, 46 (1999).
Horning et al., "Wafer-to-wafer bond characterization by defect decoration etching," Proceedings of the Second International Symposium on Semiconductor Wafer Bonding: Science, Technology and Applications, The Electrochemical Society Proceedings, vol. 93-29 (1993), pp. 199-206.
Huang, Qing-An et al., "Biased-Voltage Controlled Thinning for Bonded Silicon-On-Insulator Wafers," Applied Physics Letters, May 29, 1995, vol. 66, pp. 2990-2991.
Hughes, Donald L., "Silicon-silicon direct wafer bonding," Proceedings of the Second International Symposium on Semiconductor Wafer Bonding: Science, Technology and Applications, The Electrochemical Society Proceedings, vol. 93-29 (1993), pp. 17-31.
International Search Report and Written Opinion mailed Mar. 7, 2019, in International Application No. PCT/US2018/060044, 14 pages.
International Search Report and Written Opinion mailed Apr. 22, 2019 in International Application No. PCT/US2018/064982, 13 pages.
Ismail, M.S. et al., "Digital Pressure-Switch Array with Aligned Silicon Fusion Bonding," J. Micromechanics and Microengineering, (1991), vol. 1, No. 4, pp. 231-236.
Ismail, M. S. et al., "One-Step Direct Bonding Process of Low Temperature Si3N4 and TiN Technology," 1993 Proceedings of the 7th International Conference on Solid State Sensors and Actuators, (1993), pp. 188-193.

Iyer et al., "Ultra thin silicon-on insulator using epitaxial etch stops," Proceedings of the Second International Symposium on Semiconductor Wafer Bonding: Science, Technology and Applications, The Electrochemical Society Proceedings, vol. 93-29 (1993), pp. 3-16.
Jiao et al., "Silicon direct bonding at low temperature near the boiling point of water," Proceedings of the Second International Symposium on Semiconductor Wafer Bonding: Science, Technology and Applications, The Electrochemical Society Proceedings, vol. 93-29 (1993), pp. 280-282.
Judge, John S., "A Study of the Dissolution of SiO2 in Acidic Fluoride Solutions", J. Electrochem. Soc.: Solid State Science, Nov. 1971, vol. 118, No. 11, pp. 1772-1775.
Kasi, R. et al., "Chemistry of Fluorine in the Oxidation of Silicon," Appl. Phys. Lett., Jun. 24, 1991, vol. 58, No. 25, pp. 2975-2977.
Kawai et al, "Structure of the interface of a bonded wafer," Proceedings of the Second International Symposium on Semiconductor Wafer Bonding: Science, Technology and Applications, The Electrochemical Society Proceedings, vol. 93-29 (1993), pp. 216-224.
Kissinger, Gudrun et al., "Void-Free Silicon-Wafer-Bond Strengthening in the 200-400° C. Range," Sensors and Actuators, 1993, vol. A36, pp. 149-156.
Köhler, J. et al., "Weibull Fracture Probability for Silicon Wafer Bond Evaluation," 147 J. Electrochemical Society 4683, 4683, 4685 (2000).
Kouvatsos et al., "Silicon-Fluorine Bonding and Fluorine Profiling in SiO2 Films Grown by NF3-Enhanced Oxidation," Appl. Phys. Lett., Aug. 17, 1992, vol. 61, No. 7, pp. 780-782.
Krauter, G. et al., "Low Temperature Silicon Direct Bonding for Application in Micromechanics: Bonding Energies for Different Combinations of Oxides", Sensors and Actuators A 70, 271-275, 1998 Elsevier Science S.A.
Kub et al., "Electrical Characteristics of Low Temperature Direct Silicon-Silicon Bonding for Power Device Applications," Electrochemical Society Proceedings vol. 97-36, (1998), pp. 466-472.
Kuo, Y., "Deposition and etching mechanisms in plasma thin film processes," In Application of Particle and Laser Beams in Materials Technology, 1995, pp. 581-593.
Kurahashi et al., "Sensors Utilizing Si Wafer Direct Bonding at Low Temperature," 1991 Proceedings of the 2nd International Symposium on Micro Machine and Human Science 173, 173.
Li et al., "Low temperature direct bonding using pressure and temperature," SPIE, vol. 3184, 124-127 (1997).
Li, Y., "Systematic Low Temperature Bonding and its Application to the Hydrogen Ion Cut Process and Three-Dimensional Structures," (1999).
Li, Y. et al., "Systematic Low Temperature Silicon Bonding Using Pressure and Temperature," 1998 Jpn. J. Appl. Phys. 37 (1998).
Ling et al., "Influence of bonding temperature on the electrical properties of Si/Si02 interfaces in bonded silicon-on-insulator-wafers" Proceedings of the Second International Symposium on Semiconductor Wafer Bonding: Science, Technology and Applications, The Electrochemical Society Proceedings, vol. 93-29 (1993), pp. 453-462.
Ljungberg et al., "Buried silicide layers in silicon using wafer bonding with cobalt as interfacial layer," Proceedings of the Second International Symposium on Semiconductor Wafer Bonding: Science, Technology and Applications, The Electrochemical Society Proceedings, vol. 93-29 (1993), pp. 249-256.
Ljungberg, Karin et al., "Improved Direct Bonding of Si and SiO2 Surfaces by Cleaning in H2SO4:H2O2:HF," Applied Physics Letters, Jul. 31, 1995vol. 67, No. 5, pp. 650-652.
Ljungberg et al., "Spontaneity of hydrophobic Si—Si bonding and properties of the bonded interfaces," Proceedings of the Second International Symposium on Semiconductor Wafer Bonding: Science, Technology and Applications, The Electrochemical Society Proceedings, vol. 93-29 (1993), pp. 473-482.
Lu, Shi-Ji et al., "A New Silicon Micromachining Method Using SOI/SDB Technology," 23 Sensors and Actuators 961 (1990).
Macary et al, "Influence of the wafer cleaning on the electrical properties of Si—Si bonded wafers," Proceedings of the Second International Symposium on Semiconductor Wafer Bonding: Sci-

(56) References Cited

OTHER PUBLICATIONS ence, Technology and Applications, The Electrochemical Society Proceedings, vol. 93-29 (1993), pp. 463-472.

Maszara, W.P. et al., "Bonding of Silicon Wafers for Silicon-on-Insulator", J. Appl. Phys., Nov. 15, 1988, vol. 64, No. 10, pp. 4943-4950.

Matsumoto, Satoshi et al., "Thin-Film Quasi-SOI Power MOSFET Fabricated by Reversed Silicon Wafer Direct Bonding," 45 IEEE Transactions on Electron Devices 105 (1998).

Mclachlan et al., "A bonded wafer bipolar process in manufacturing," Proceedings of the Second International Symposium on Semiconductor Wafer Bonding: Science, Technology and Applications, The Electrochemical Society Proceedings, vol. 93-29 (1993), pp. 43-54.

Mitani et al, "Investigation of the N-type inversion layer induced at the bottom of P-type active silicon layers in bonded SOI wafers," Proceedings of the Second International Symposium on Semiconductor Wafer Bonding: Science, Technology and Applications, The Electrochemical Society Proceedings, vol. 93-29 (1993), pp. 443-452.

Morita, M. et al., "Fluorine-Enhanced Thermal Oxidation of Silicon in the Presence of NF3," Appl. Phys. Lett., Dec. 15, 1984, vol. 45, No. 12, pp. 1312-1314.

Mumola et al., "Plasma-thinned silicon-on-insulator bonded wafers," Proceedings of the Second International Symposium on Semiconductor Wafer Bonding: Science, Technology and Applications, The Electrochemical Society Proceedings, vol. 93-29 (1993), pp. 410-422.

Nishioka, Yasushiro et al., "Dielectric Characteristics of Fluorinated Ultradry SiO2," Appl. Phys. Lett., Mar. 20, 1999, vol. 54, No. 12, pp. 1127-1129.

Nishizawa et al., "An advanced dielectric isolation structure for SOI-CMOS/BICMOS VLSIs," Proceedings of the Second International Symposium on Semiconductor Wafer Bonding: Science, Technology and Applications, The Electrochemical Society Proceedings, vol. 93-29 (1993), pp. 176-188.

Niwano et al., "Morphology of Hydrofluoric Acid and Ammonium Fluoride-Treated Silicon Surfaces Studied by Surface Infrared Spectroscopy," J. Appl. Phys., Jun. 1, 1992, vol. 71, No. 11, pp. 5646-5649.

Oberlin, David W., "A New Air-Isolation Process for Monolithic Integrated Circuits," 17 IEEE Transactions on Electron Devices 485 (1970).

Pankov et al., "Analysis of structural changes in plasma-deposited fluorinated silicon dioxide films caused by fluorine incorporation using ring-statistics based mechanism," Journal of Applied Physics AIP USA, Jul. 1, 1999, vol. 86, No. 1, pp. 275-280.

Quenzer, H. J. et al., "Low Temperature Wafer Bonding for Micromechanical Applications," 1992 Micro Electro Mechanical Systems, 1992, MEMS '92 49, 52.

Rabinovich, Eliezer M. et al., "Retention of Fluorine in Silica Gels and Glass," J. Am. Ceram. Soc., 1989, vol. 72, No. 7, pp. 1229-1232.

Reiche et al., "Characterization of interfaces of directly bonded silicon wafers: A comparative study of secondary ion mass spectroscopy multiple internal reflection spectroscopy, and transmission electron microscopy," Jpn. J. Appl. Phys., vol. 35 (1996), pp. 2102-2107, Part 1, No. 4A, Apr. 1996.

Reiche et al., "The effect of a plasma pretreatment on the Si/Si bonding behaviouir," Electrochemical Society Proceedings, 1998, vol. 97-36, pp. 437-444.

Robb et al., "High temperature lateral dopant diffusion in WSi2, TiSi2 and TiN films," Proceedings of the Second International Symposium on Semiconductor Wafer Bonding: Science, Technology and Applications, The Electrochemical Society, Proceedings vol. 93-29 (1993), pp. 230-239.

Roberds et al., "Low temperature , in situ, plasma activated wafer bonding," Electrochemical Society Proceedings, 1997, vol. 97-36, pp. 598-606.

Roberds et al., "Low temperature silicon direct bonding," Department of Mechanical, Aeronautical, and Materials Engineering, University of California, Davis, 1997, pp. 240-248.

Roberds, B.E. et al., "Wafer Bonding of GaAS, InP, and Si Annealed Without Hydrogen for Advanced Device Technologies," Electrochemical Society Proceedings, 1997, vol. 97-36, pp. 592-597.

Rouse et al, "Application of 150 mm bonded wafer technology to a power asic process," Proceedingsof the Second International Symposium on Semiconductor Wafer Bonding: Science, Technology and Applications, The Electrochemical Society Proceedings, vol. 93-29 (1993), pp. 283-292.

Sailer et al., Creating 3D Circuits Using Transferred Films, Circuits and Devices, IEEE 1997, Nov. 1997, pp. 27-30.

Saitoh et al., "Characterization of directly bonded silicon-on-insulator structures using spectroscopic ellipsometry," Proceedings of the Second International Symposium on Semiconductor Wafer Bonding: Science, Technology and Applications, The Electrochemical Society Proceedings, vol. 93-29 (1993), pp. 207-215.

Sakakibara et al., "A wafer bonded—SOI bipolar transistor," Proceedings of the Second International Symposium on Semiconductor Wafer Bonding: Science, Technology and Applications, The Electrochemical Society Proceedings, vol. 93-29 (1993), pp. 152-160.

Samsung Electronics Co., LTD. and Samsung Electronics America, Inc. v. Invensas Bonding Technologies, Inc., Petition for Inter Partes Review of U.S. Pat. No. 9,431,368, dated Oct. 1, 2018, pp. 1-84, (IPR2019-00007_368_IPR_Petition).

Samsung Electronics Co., LTD. and Samsung Electronics America, Inc. v. Invensas Bonding Technologies, Inc., Petition for Inter Partes Review of U.S. Pat. No. 9,391,143, dated Oct. 2, 2018, pp. 1-65, (IPR2019-00020_143_I_IPR_Petition)(Part 1).

Samsung Electronics Co., LTD. and Samsung Electronics America, Inc. v. Invensas Bonding Technologies, Inc., Petition for Inter Partes Review of U.S. Pat. No. 9,391,143, dated Oct. 2, 2018, pp. 1-83, (IPR2019-00021_143_II_IPR_Petition) (Part 2).

Samsung Electronics Co., LTD. and Samsung Electronics America, Inc. v. Invensas Bonding Technologies, Inc., Petition for Inter Partes Review of U.S. Pat. No. 7,553,744, dated Oct. 1, 2018, pp. 1-74, (Petition—U.S. Pat. No. 7,553,744—IPR2019-00001).

Samsung Electronics Co., LTD. and Samsung Electronics America, Inc. v. Invensas Bonding Technologies, Inc., Petition for Inter Partes Review of U.S. Pat. No. 7,807,549, dated Oct. 1, 2018, pp. 1-69, (Petition—U.S. Pat. No. 7,807,549—IPR2019-00004).

Samsung Electronics Co., LTD. and Samsung Electronics America, Inc. v. Invensas Bonding Technologies, Inc., Petition for Inter Partes Review of U.S. Pat. No. 7,807,549, dated Oct. 1, 2018, pp. 1-48, (Petition—U.S. Pat. No. 7,807,549—IPR2019-00005).

Samsung Electronics Co., LTD. and Samsung Electronics America, Inc. v. Invensas Bonding Technologies, Inc., Petition for Inter Partes Review of U.S. Pat. No. 7,871,898, dated Oct. 1, 2018, pp. 1-82, (Petition—U.S. Pat. No. 7,871,898—IPR2019-00006).

Samsung Electronics Co., LTD. and Samsung Electronics America, Inc. v. Invensas Bonding Technologies, Inc., Petition for Inter Partes Review of U.S. Pat. No. 8,153,505, dated Oct. 2, 2018, pp. 1-59, (Petition—U.S. Pat. No. 8,153,505—IPR2019-00022).

Samsung Electronics Co., LTD. and Samsung Electronics America, Inc. v. Invensas Bonding Technologies, Inc., Petition for Inter Partes Review of U.S. Pat. No. 8,153,505, dated Oct. 2, 2018, pp. 1-67, (Petition—U.S. Pat. No. 8,153,505—IPR2019-00023).

Schmidt, Martin A., "Wafer-To-Wafer Bonding for Microstructure Formation," 86 Proceedings of the IEEE 1575, 1578 (1998).

Schumacher, Andreas et al., "The Bonding Energies of Oxidized Silicon Wafers for Micromechanical Applications at Moderate Temperatures," Electrochemical Society Proceedings vol. 97-36, (1998), pp. 155-162.

Shajii et al., "A backside contact technology for a wafer-bonded liquid shear-stress sensor," Proceedings of the Second International Symposium on Semiconductor Wafer Bonding: Science, Technology and Applications, The Electrochemical Society Proceedings, vol. 93-29 (1993), pp. 340-347.

Shimbo, M. et al., "Silicon-to-Silicon Direct Bonding Method," J. Appl. Phys., Oct. 15, 1986, vol. 60, No. 8, pp. 2987-2989.

Södernärg et al., "Formation of heat sinks using bonding and etch back technique in combination with diamond deposition," Proceed-

(56) References Cited

OTHER PUBLICATIONS ings of the Second International Symposium on Semiconductor Wafer Bonding: Science, Technology and Applications, The Electrochemical Society Proceedings, vol. 93-29 (1993), pp. 382-391.

Sooriakumar et al., "Thermal mismatch strain in anodically bonded silicon and glass," Proceedings of the Second International Symposium on Semiconductor Wafer Bonding: Science, Technology and Applications, The Electrochemical Society Proceedings, vol. 93-29 (1993), pp. 225-229.

Stanley, Timothy, "Revenue sensitivity to yield and starting wafer cost in SOI SRAM production," Proceedings of the Second International Symposium on Semiconductor Wafer Bonding: Science, Technology and Applications, The Electrochemical Society Proceedings, vol. 93-29 (1993), pp. 303-309.

Stengl, R. et al., "A Model for the Silicon Wafer Bonding Process", Jpn. J. Appl. Phys., Oct. 1989, vol. 28, No. 10, pp. 1735-1741.

Steinkirchner, Johann et al., "Silicon Wafer Bonding via Designed Monolayers," 7 Advanced Materials 7, 662 (1995).

Suga, T., "Room-temperature bonding on metals and ceramics," Proceedings of the Second International Symposium on Semiconductor Wafer Bonding: Science, Technology and Applications, The Electrochemical Society Proceedings, vol. 93-29 (1993), pp. 71-80.

Sun et al., "Cool plasma activated surface in silicon wafer direct bonding technology," Journal De Physique, Sep. 1988, pp. C4-79-C4-82.

Sunada, Takeshi et al., "The Role of Fluorine Termination in the Chemical Stability of HF-Treated Si Surfaces," Jpn, J. Appl. Phys., Dec. 1990, vol. 29, No. 12, pp. L2408-L2410.

Takagi et al., "Effect of surface roughness on room-temperature wafer bonding by Ar beam surface activation," Jpn. J. Appl. Phys., vol. 37, No. 7, Jul. 1998, pp. 4197-4203.

Takagi et al., "Low temperature direct bonding of silicon and silicon dioxide by the surface activation method," Transducers 1997, 1997 Int. Conf. on Solid State Sensors and Actuators, Jun. 16-19, 1997, pp. 657-660.

Takagi, Hideki et al., "Room-Temperature Bonding of Lithium Niobate and Silicon Wafers by Argon-Beam Surface Activation," Appl. Phys. Lett., Apr. 19, 1999, vol. 74, No. 16, pp. 2387-2389.

Takagi, H. et al., "Surface Activated Bonding of Silicon Wafers at Room Temperature," Appl. Phys. Lett., Apr. 15, 1996, vol. 68, No. 16, pp. 2222-2224.

Takagi, H. et al., "Transmission Electron Microscope observations of Si/Si Interface Bonded at Room Temperature by Ar Beam Surface Activation", Jpn. J. Appl. Phys., Mar. 1999, vol. 28, Part 1, No. 3A, pp. 1589-1594.

Takagi, Hideki et al., "Low-Temperature Direct Bonding of Silicon and Silicon Dioxide by the Surface Activation Method", Sensors and Actuators A, Oct. 1, 1998, vol. 70, No. 1-2, pp. 164-170.

Tong, Q.-Y. et al., "A Model of Low-Temperature Wafer Bonding and its Applications," J. Electrochem. Soc., May 1996, vol. 143, No. 5, pp. 1773-1779.

Tong et al., "A "smarter-cut" approach to low temperature silicon layer transfer," Appl. Phys. Lett. Jan. 5, 1998, vol. 72, No. 1, pp. 49-51.

Tong, Q.-Y. et al., "Diffusion and Oxide Viscous Flow Mechanism in SDB Process and Silicon Wafer Rapid Thermal Bonding," Electronic Letters, May 1990, vol. 26, Issue 11, pp. 697-699.

Tong et al., "Fabrication of Ultrathin SOI by SIMOX Wafer Bonding (SWB)," Journal of Electronic Materials, vol. 22, No. 7, 1993, 763-768.

Tong, Q.-Y. et al., "Feasibility Study of VLSI Device Layer Transfer by CMP PETEOS Direct Bonding," Proceedings 1996 IEEE International SOI Conference, Oct. 1996, pp. 36 and 37.

Tong et al., "Hydrophobic silicon wafer bonding," Appl. Phys. Lett., Jan. 31, 1994, vol. 64, No. 5, pp. 625-627.

Tong, Q.-Y. et al., "Layer Splitting Process in Hydrogen-Implanted Si, Ge, SiC, and Diamond Substrates," Appl. Phys. Lett., Mar. 17, 1997, vol. 70, No. 11, pp. 1390-1392.

Tong et al., "Low temperature InP layer transfer," Electronics Letters, Feb. 18, 1999, vol. 35, No. 4, pp. 341-342.

Tong, Q.-Y. et al., "Low Temperature Si Layer Splitting," 1997 Proceedings 1997 IEEE International SOI Conference 126.

Tong et al., "Low temperature wafer direct bonding," Journal of Microelectomechanical Systems, Mar. 1994, vol. 3, No. 1, pp. 29-35.

Tong et al., "Low temperature wafer direct bonding," Proceedings of the Second International Symposium on Semiconductor Wafer Bonding: Science, Technology and Applications, The Electrochemical Society Proceedings, vol. 93-29 (1993), pp. 96-106.

Tong, Q.-Y. et al., "Low Vacuum Wafer Bonding," Electrochemical and Solid-State Letters, 1998, vol. 1, No. 1, pp. 52-53.

Tong et al., "Materials with a buried C60 layer produced by direct wafer bonding," J. Electrochem Soc., vol. 141, No. 10, Oct. 1994, pp. 137-138.

Tong, Q.-Y. et al., "Semiconductor Wafer Bonding: Recent Developments", Materials Chemistry and Physics, 1994, vol. 37, pp. 101-127.

Tong, Q.-Y. et al., Semiconductor Wafer Bonding Science and Technology, John Wiley & Sons, Inc., New York, 1999.

Tong, Q.-Y. et al., "Silicon Carbide Wafer Bonding," J. Electrochemical Society, Jan. 1995, vol. 142, No. 1, pp. 232-236.

Tong, Q.-Y. et al., "Thickness Considerations in Direct Silicon Wafer Bonding," J. Electrochemical Society, 142.11, (1995), pp. 3975-3979.

Tong, Q.-Y. et al., "Transfer of Semiconductor and Oxide Films by Wafer Bonding and Layer Cutting," J. Electronic Materials, (2000), vol. 29, No. 7, pp. 928-933.

Tong et al., "Ultrathin single-crystalline silicon on quartz (SOQ) by 150 C wafer bonding," Sensors and Actuators A 48 (1995) 117-123.

Tong et al., "Wafer bonding and layer splitting for microsystems **," Advanced Materials, 1999, vol. 11, No. 17, pp. 1409-1425.

Tong, Q.-Y. et al., "Wafer Bonding of Si With Dissimilar Materials," pp. 524-526 (1995).

Vossen, John L. et al., Thin Film Processes, Academic Press (1978) (excerpts).

Vossen, John L. et al., Thin Film Processes II, Academic Press (1991) (excerpts).

Watt, V.H.C. et al., "Low Temperature Direct Bonding on Nonhydrophilic Surfaces," 30 Electronic Letters 693, 694 (1994).

Weldon et al., "Physics and chemistry of silicon wafer bonding investigated by infrared absorption spectroscopy," Journal of Vacuum Science & Technology B, Jul./Aug. 1996, vol. 14, No. 4, pp. 3095-3106.

Williams et al., "Mobile Fluoride Ions in SiO2", Journal of Applied Physics, Feb. 1975, vol. 46, No. 2, pp. 695-698.

Wright, Peter J. et al., "The Effect of Fluorine in Silicon Dioxide Gate Dielectrics," IEEE Transactions on Electron Devices, May 1989, vol. 36, No. 5, pp. 879-889.

Xu et al., "Novel Two-Step SDB Technology for High-Performance Thin-Film SOI/MOSFET Applications," Electronics Letters, Mar. 16, 1989, vol. 25, No. 6 pp. 394-395.

Xu et al., "Silicon on Quartz by Solid-State Diffusion Bonding (SSDB) Technology," Electronics Letters, May 26, 1988, vol. 24, No. 11 pp. 691-692.

Yallup, Kevin, "Analog CMOS circuits on thick film SOI," Proceedings of the Second International Symposium on Semiconductor Wafer Bonding: Science, Technology and Applications, The Electrochemical Society Proceedings, vol. 93-29 (1993), pp. 117-128.

Yokoi, Hideki et al., "Analysis of GaInAsP Surfaces by Contact-Angle Measurement for Wafer Direct Bonding with Garnet Crystals," 38 Japanese J. Applied Physics 4780 (1999).

Yoshimaru, M. et al., "Interaction Between Water and Fluorine-Doped Silicon Oxide Films Deposited by Plasma-Enhanced Chemical Vapor Deposition," J. Vac. Sci. Technol. A, Nov./Dec. 1997, vol. 15, No. 6, pp. 2915-2922.

*Ziptronix, Inc.* v. *Omnivision Technologies*, Complaint for Patent Infringement, Case 4:10-cv-05525- SBA, Document 48, filed May 4, 2011, pp. 1-29.

*Ziptronix, Inc.* v. *Ominvision Technologies*, Defendant TSMC's Answer and Affirmative Defenses to Ziptronix First Amended Complaint, Case No. 4:10-cv-05525-SBA, Document 49, filed May 4, 2011, pp. 1-45.

(56) References Cited

OTHER PUBLICATIONS

*Ziptronix, Inc.* v. *Omnivision Technologies*, Complaint for Patent Infringement, Case No. 4:10-cv-05525-SBA Document 1, filed Dec. 16, 2010, pp. 1-17.
*Ziptronix, Inc.* v. *Omnvision Technologies, Inc.*, Defendants' Third Supplemental Consolidated Invalidity Contentions Under Patent Local Rule 3-3, Case No. 4:10-cv-05525-SBA, filed Jun. 14, 2013, pp. 1-5379, (submitted in multiple parts).
Zucker et al., "Application of oxygen plasma processing to silicon direct bonding," Sensors and Actuators A, 36 (1993), pp. 227-231.
Bush, Steve, "Electronica: Automotive power modules from On Semi," ElectronicsWeekly.com, indicating an ONSEMI AR0820 product was to be demonstrated at a Nov. 2018 trade show, https://www.electronicsweekly.com/news/products/power-supplies/electronica-automotive-power-modules-semi-2018-11/ (published Nov. 8, 2018; downloaded Jul. 26, 2023).
Morrison, Jim et al., "Samsung Galaxy S7 Edge Teardown," Tech Insights (posted Apr. 24, 2016), includes description of hybrid bonded Sony IMX260 dual-pixel sensor, https://www.techinsights.com/blog/samsung-galaxy-s7-edge-teardown, downloaded Jul. 11, 2023, 9 pages.
ONSEMI AR0820 image, cross section of a CMOS image sensor product. The part in the image was shipped on Sep. 16, 2021. Applicant makes no representation that the part in the image is identical to the part identified in the separately submitted reference BUSH, Nov. 8, 2018, ElectronicsWeekly.com ("BUSH article"); however, the imaged part and the part shown in the BUSH article share the part number "ONSEMI AR0820.".
Sony IMX260 image, cross section of Sony dual-pixel sensor product labeled IMX260, showing peripheral probe and wire bond pads in a bonded structure. The part in the image was shipped in Apr. 2016. Applicant makes no representation that the part in the image is identical to the part identified in the separately submitted reference Morrison et al. (Tech Insights article dated Apr. 24, 2016), describing and showing a similar sensor product within the Samsung Galaxy S7; however the imaged part and the part shown in the Morrison et al. article share the part name "Sony IMX260.".
SAMCO Inc., "Plasma Cleaning of Metals (Copper & Silver) Without Surface Oxidationi". Downloaded on Aug. 11, 2023 online: https://www.samcointl.com/featured-solutions/plasma-cleaning-metal-copper-silver/; 13 pages.

* cited by examiner

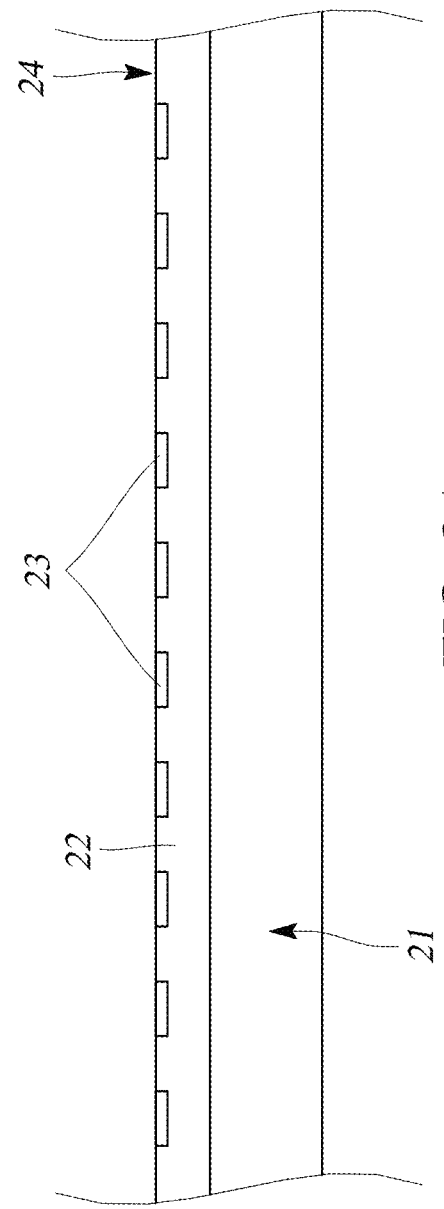
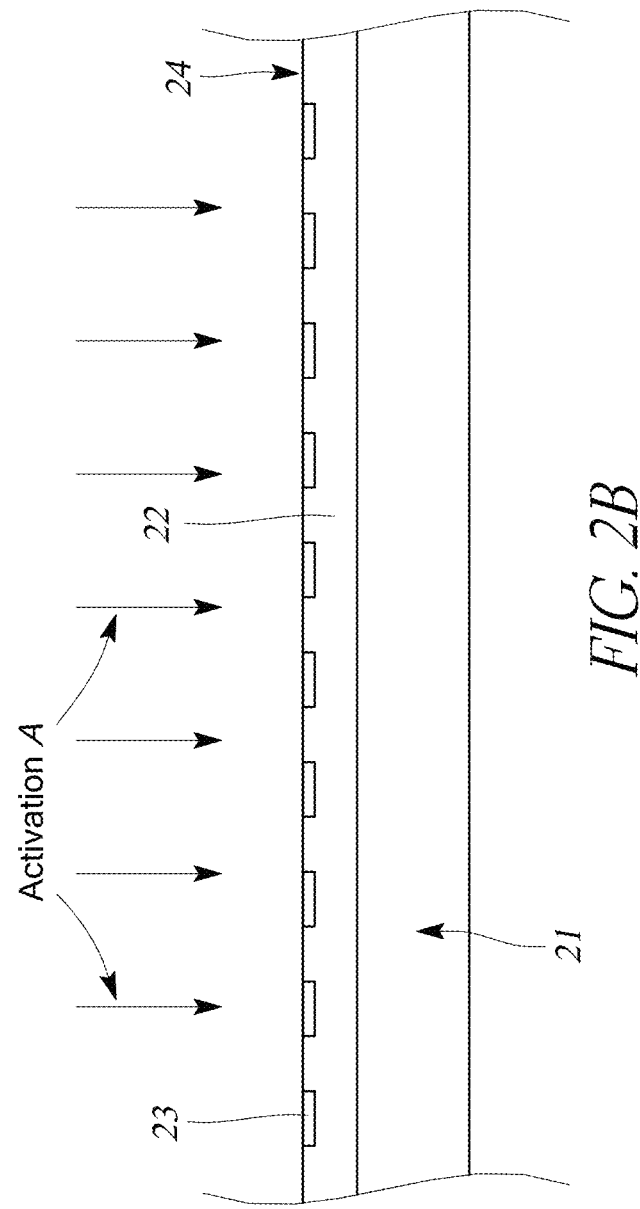

DIRECT BONDING METHODS AND STRUCTURES

CROSS-REFERENCE TO RELATED APPLICATIONS

This application claims priority to U.S. Provisional Patent Application No. 63/107,228, filed Oct. 29, 2020, the entire contents of which are hereby incorporated by reference herein in their entirety and for all purposes.

BACKGROUND

Field

The field relates to direct bonding methods and structures.

Description of the Related Art

The demand for more compact physical arrangements of microelectronic elements such as integrated chips and device dies has become even more intense with the rapid progress of portable electronic devices, the expansion of the Internet of Things, nano-scale integration, subwavelength optical integration, and more. Merely by way of example, devices commonly referred to as "smart phones" integrate the functions of a cellular telephone with powerful data processors, memory and ancillary devices such as global positioning system receivers, electronic cameras, and local area network connections along with high-resolution displays and associated image processing chips. Such devices can provide capabilities such as full internet connectivity, entertainment including full-resolution video, navigation, electronic banking, sensors, memories, microprocessors, healthcare electronics, automatic electronics, and more, all in a pocket-size device. Complex portable devices require packing numerous chips and dies into a small space.

Microelectronic elements often comprise a thin slab of a semiconductor material, such as silicon or gallium arsenide or others. Chips and dies are commonly provided as individual, prepackaged units. In some unit designs, the die is mounted to a substrate or a chip carrier, which is in turn mounted on a circuit panel, such as a printed circuit board (PCB). Dies can be provided in packages that facilitate handling of the die during manufacture and during mounting of the die on the external substrate. For example, many dies are provided in packages suitable for surface mounting. Numerous packages of this general type have been proposed for various applications. Most commonly, such packages include a dielectric element, commonly referred to as a "chip carrier" with terminals formed as plated or etched metallic structures on the dielectric. The terminals typically are connected to the contact pads (e.g., bond pads or metal posts) of the die by conductive features such as thin traces extending along the die carrier and by fine leads or wires extending between the contacts of the die and the terminals or traces. In a surface mounting operation, the package may be placed onto a circuit board so that each terminal on the package is aligned with a corresponding contact pad on the circuit board. Solder or other bonding material is generally provided between the terminals and the contact pads. The package can be permanently bonded in place by heating the assembly so as to melt or "reflow" the solder or otherwise activate the bonding material.

Many packages include solder masses in the form of solder balls that are typically between about 0.025 mm and about 0.8 mm (1 and 30 mils) in diameter, and are attached to the terminals of the package. A package having an array of solder balls projecting from its bottom surface (e.g., surface opposite the front face of the die) is commonly referred to as a ball grid array or "BGA" package. Other packages, referred to as land grid array or "LGA" packages are secured to the substrate by thin layers or lands formed from solder. Packages of this type can be quite compact. Certain packages, commonly referred to as "chip scale packages," occupy an area of the circuit board equal to, or only slightly larger than, the area of the device incorporated in the package. This scale is advantageous in that it reduces the overall size of the assembly and permits the use of short interconnections between various devices on the substrate, which in turn limits signal propagation time between devices and thus facilitates operation of the assembly at high speeds.

Semiconductor dies can also be provided in "stacked" arrangements, wherein one die is provided on a carrier, for example, and another die is mounted on top of the first die. These arrangements can allow a number of different dies to be mounted within a single footprint on a circuit board and can further facilitate high-speed operation by providing a short interconnection between the dies. Often, this interconnect distance can be only slightly larger than the thickness of the die itself. For interconnection to be achieved within a stack of die packages, interconnection structures for mechanical and electrical connection may be provided on both sides (e.g., faces) of each die package (except for the topmost package). This has been done, for example, by providing contact pads or lands on both sides of the substrate to which the die is mounted, the pads being connected through the substrate by conductive vias or the like.

Dies or wafers may also be stacked in other three-dimensional arrangements as part of various microelectronic packaging schemes. This can include stacking layers of one or more dies or wafers on a larger base die or wafer, stacking multiple dies or wafers in vertical or horizontal arrangements, or stacking similar or dissimilar substrates, where one or more of the substrates may contain electrical or non-electrical elements, optical or mechanical elements, and/or various combinations of these. Dies or wafers may be bonded in a stacked arrangement using various bonding techniques, including direct dielectric bonding, non-adhesive techniques, such as ZiBond® or a hybrid bonding technique, such as DBI®, both available from Invensas Bonding Technologies, Inc. (formerly Ziptronix, Inc.), an Xperi company (see for example, U.S. Pat. Nos. 6,864,585 and 7,485,968, which are incorporated herein in their entirety). When bonding stacked dies using a direct bonding technique, it is usually desirable that the surfaces of the dies to be bonded be extremely flat and smooth. For instance, in general, the surfaces should have a very low variance in surface topology, so that the surfaces can be closely mated to form a lasting bond. For example, it is generally preferable that the variation in roughness of the bonding surfaces be less than 3 nm and preferably less than 1.0 nm.

Some stacked die arrangements are sensitive to the presence of particles or contamination on one or both surfaces of the stacked dies. For instance, particles remaining from processing steps or contamination from die processing or tools can result in poorly bonded regions between the stacked dies, or the like. Extra handling steps during die processing can further exacerbate the problem, leaving behind unwanted residues.

BRIEF DESCRIPTION OF THE DRAWINGS

FIGS. 2A-2D schematically illustrate a bonding method according to various embodiments.

DETAILED DESCRIPTION

Figure 1:
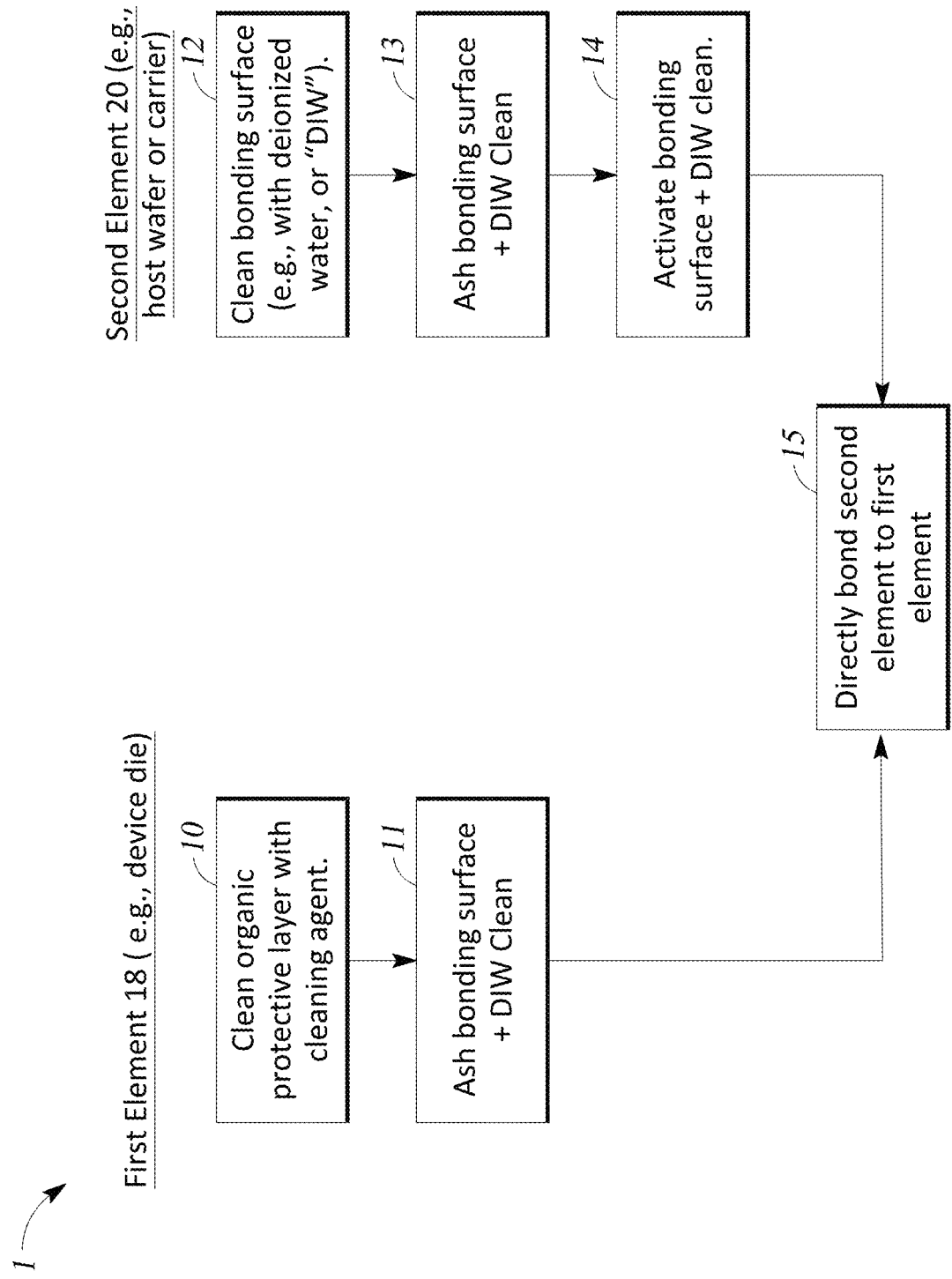
FIG. 1 is a flow chart illustrating a process for directly bonding first and second elements.

Two or more semiconductor elements (such as integrated device dies, wafers, etc.) may be stacked on or bonded to one another to form a bonded structure. Conductive contact pads of one element may be electrically connected to corresponding conductive contact pads of another element. Any suitable number of elements can be stacked in the bonded structure. As used herein, contact pads may include any suitable conductive feature within an element configured to bond (e.g., directly bond without an adhesive) to an opposing conductive feature of another element. For example, in some embodiments, the contact pad(s) may comprise a discrete metallic contact surface formed in a bonding layer of an element. In some embodiments, the contact pad(s) may comprise exposed end(s) of a through-substrate via (TSV) that extends at least partially through an element.

In some embodiments, the elements are directly bonded to one another without an adhesive. In various embodiments, a dielectric field region (also referred to as a nonconductive bonding region) of a first element (e.g., a first semiconductor device die with active circuitry) can be directly bonded (e.g., using dielectric-to-dielectric bonding techniques) to a corresponding dielectric field region of a second element (e.g., a second semiconductor device die with active circuitry) without an adhesive. For example, dielectric-to-dielectric bonds may be formed without an adhesive using the direct bonding techniques disclosed at least in U.S. Pat. Nos. 9,564,414; 9,391,143; and 10,434,749, the entire contents of each of which are incorporated by reference herein in their entirety and for all purposes.

In various embodiments, hybrid direct bonds can be formed without an intervening adhesive. For example, dielectric bonding surfaces can be polished to a high degree of smoothness. The bonding surfaces can be cleaned and exposed to a plasma and/or etchants to activate the surfaces. In some embodiments, the surfaces can be terminated with a species after activation or during activation (e.g., during the plasma and/or etch processes). Without being limited by theory, in some embodiments, the activation process can be performed to break chemical bonds at the bonding surface, and the termination process can provide additional chemical species at the bonding surface that improves the bonding energy during direct bonding. In some embodiments, the activation and termination are provided in the same step, e.g., a plasma or wet etchant to activate and terminate the surfaces. In other embodiments, the bonding surface can be terminated in a separate treatment to provide the additional species for direct bonding. In various embodiments, the terminating species can comprise nitrogen. Further, in some embodiments, the bonding surfaces can be exposed to fluorine. For example, there may be one or multiple fluorine peaks near layer and/or bonding interfaces. Thus, in the directly bonded structures, the bonding interface between two dielectric materials can comprise a very smooth interface with higher nitrogen content and/or fluorine peaks at the bonding interface. Additional examples of activation and/or termination treatments may be found throughout U.S. Pat. Nos. 9,564,414; 9,391,143; and 10,434,749, the entire contents of each of which are incorporated by reference herein in their entirety and for all purposes.

In various embodiments, conductive contact pads of the first element can be directly bonded to corresponding conductive contact pads of the second element. For example, a hybrid bonding technique can be used to provide conductor-to-conductor direct bonds along a bond interface that includes covalently direct bonded dielectric-to-dielectric surfaces, prepared as described above. In various embodiments, the conductor-to-conductor (e.g., contact pad to contact pad) direct bonds and the dielectric-to-dielectric hybrid bonds can be formed using the direct bonding techniques disclosed at least in U.S. Pat. Nos. 9,716,033 and 9,852,988, the entire contents of each of which are incorporated by reference herein in their entirety and for all purposes.

For example, dielectric bonding surfaces can be prepared and directly bonded to one another without an intervening adhesive as explained above. Conductive contact pads (which may be surrounded by nonconductive dielectric field regions) may also directly bond to one another without an intervening adhesive. In some embodiments, the respective contact pads can be recessed below exterior (e.g., upper) surfaces of the dielectric field or nonconductive bonding regions, for example, recessed by less than 20 nm, less than 15 nm, or less than 10 nm, for example, recessed in a range of 2 nm to 20 nm, or in a range of 4 nm to 10 nm. The nonconductive bonding regions can be directly bonded to one another without an adhesive at room temperature in some embodiments and, subsequently, the bonded structure can be annealed. Upon annealing, the laterally confined contact pads can expand and contact one another to form a metal-to-metal direct bond. Beneficially, the use of Direct Bond Interconnect, or DBI®, techniques can enable high density of pads connected across the direct bond interface (e.g., small or fine pitches for regular arrays). In various embodiments, the contact pads can comprise copper or copper alloys, although other metals may be suitable. In some embodiments, the contact pads can be arranged in an array having a regular or irregular pitch. In some embodiments, to the extent the contacts are regularly spaced from one other across the element, or across groups within the element, the pitch of the contact pads may be less 40 microns, less than 10 microns, or less that 2 microns. For some embodiments, the ratio of the pitch of the contact pads to a dimension (e.g., a diameter) of the contact pad can be less than 5, less than 3, or less than 2.

In various embodiments, the contact pads can be formed in respective first and second arrays of pads on the first and second elements. If any debris or surface contaminant is present at the surface of the first or second elements, voids may be created at the bond interface, or debris may intervene between opposing contact pads. In addition, reactant byproducts generated during bonding and annealing, e.g. hydrogen and water vapor, may also form voids at the bond interface. These voids may effectively inhibit the joining of particular contact pads in the vicinity, creating openings or other failures in the bond. For example, any void larger than the pad diameter (or pitch) can potentially create an opening and direct bond failure. In some embodiments, depending on the location of the voids, voids that are comparable in size to or smaller than the pad diameter (at least partially located over pad) may be the source of failure in the bonded structure or structures.

Thus, in direct bonding processes, a first element can be directly bonded to a second element without an intervening adhesive. In some arrangements, the first element can comprise a singulated element, such as a singulated integrated device die. In other arrangements, the first element can comprise a carrier or substrate (e.g., a wafer) that includes a plurality (e.g., tens, hundreds, or more) of device regions that, when singulated, form a plurality of integrated device dies. Similarly, the second element can comprise a singulated element, such as a singulated integrated device die. In other arrangements, the second element can comprise a carrier or substrate (e.g., a wafer).

As an example, in one embodiment, the first element can comprise a singulated device die, and the second element can comprise a wafer. In such an embodiment, the first element may be initially provided in wafer form or on a larger dielectric substrate and singulated to form the singulated first element. However, the singulation process and/or other processing steps may produce debris that can contaminate the planar bonding surface, which can leave voids and/or defects when two elements are bonded. Accordingly, prior to singulation, a protective layer can be provided over the bonding surface before singulation and direct bonding in order to prevent debris from contaminating the bonding surface. The protective layer can comprise an organic or inorganic layer (e.g., a photoresist or spin on glass) that is deposited (e.g., spin coated onto) the bonding surface. Additional details of the protective layer may be found throughout U.S. Pat. No. 10,714,449, the entire contents of which are incorporated by reference herein in their entirety and for all purposes. The wafer containing the first element can be singulated using any suitable method. The protective layer over the bonding surface can beneficially protect the bonding surface from debris.

FIG. 1 is a flow chart illustrating a process 1 for directly bonding first and second elements. In FIG. 1, the first element can comprise a singulated die, e.g., a singulated device die, and the second element can comprise a substrate, such as a host wafer or carrier. In other embodiments, the second element can comprise a second die. As explained above, prior to singulation, a protective layer (e.g., an organic protective layer) can be provided over the wafer to protect the wafer during singulation or dicing. As shown in block 10 of FIG. 1, the organic protective layer on the singulated first element can be cleaned from the bonding surface with a cleaning agent, for example such as a suitable solvent, an alkaline solution or other suitable cleaning agent as recommended by the supplier of the protective layer. The protective layer cleaning agent can be selected such that it does not substantially roughen the smooth bonding surface of the dielectric layer and does not substantially etch the metal of the contact pad to increase the recess of the pad metal. An excessive pad recess may form a recess that is too deep, which may prevent (or reduce the strength of) pad-to-pad bonding at the appropriate annealing conditions (e.g., annealing temperature and times). For example, the annealing temperature may vary in a range of 150° C. to 350° C., or higher. The annealing times may range between 5 minutes to over 120 minutes. The cleaning agent can be applied by a fan spray of the liquid cleaning agent or other methods known to those having skill in the art. Turning to block 11, the cleaned bonding surface can be ashed (e.g., using an oxygen plasma) and cleaned with deionized water (DIW). The ashing step of block 11 can remove any residual organic material from the protective layer. In some embodiments, the cleaned first element can be activated before direct bonding.

In a block 12, the second element (which can comprise a wafer in this embodiment, but in other embodiments can comprise an integrated device die) can also be cleaned with DIW. In a block 13, the bonding surface can be ashed (e.g., using an oxygen plasma) to remove any organic material and cleaned with DIW. Further, as shown in block 14 of FIG. 1, the bonding surface of the second element can be activated. In various embodiments, the activation can comprise exposing the bonding surface of the second element to a plasma, such as a nitrogen-containing plasma. In other embodiments, the activation can comprise exposing the bonding surface of the second element to an oxygen plasma. As explained above, the activation process (which may also terminate the bonding surface) can break bonds at the bonding surface and replace the broken bonds with chemical species that enhance the bonding energy of the direct bond. As shown in block 14 of FIG. 1, the activated surface can be cleaned with DIW, which may serve to wash any residue away before bonding without degrading the bonding surface of the first or second element.

In a block 15, the first and second elements can be brought together to directly contact one another at room temperature. As explained herein, the nonconductive bonding regions of the first and second elements can spontaneously bonds at room temperature, without application of external pressure, and without application of a voltage. The structure can be annealed to cause the conductive contact pads to expand and form electrical connections and to also increase the bonding energy between the respective bonded nonconductive bonding regions of the first and second elements.

In the bonding arrangement shown in FIG. 1, only the second element may be activated before direct bonding. As explained in U.S. Pat. No. 10,727,219, which is incorporated by reference herein in its entirety and for all purposes, the bonded strength between two elements may be sufficiently strong when only one of the two elements is activated before bonding. However, in other arrangements, both the first element and the second element may be activated prior to bonding, or, alternatively, only the first element may be activated before bonding.

In some cases, the direct bond that results from the process 1 shown in FIG. 1 may include voids and/or other defects at the bond interface. For example, when the first and second elements are brought together, a bonding wave may travel from the center of the elements outwards from where the initial contact occurred. When the bonding wave travels sufficiently fast, the wave may travel non-symmetrically radially outwards from the center of the bonded elements to the edges of the elements. In such cases, the bonding wave may prematurely wrap around itself so as to trap the void or escaping gas (e.g., air bubble or bubbles) along the bond interface. It can be beneficial to modulate the motion of the bonding wave so that voids are eliminated or reduced, and to generally improve the bonding energy between the first and second elements. Also, it may be advantageous to increase the bonding energy of the bonded elements. High bond energy between bonded elements improves the reliability of the bonded structure.

Figure 2C:
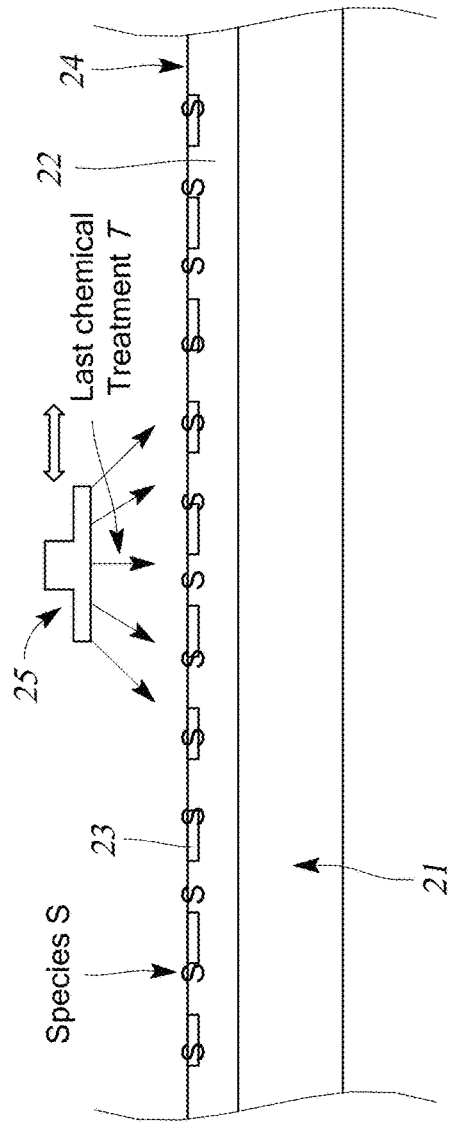

FIGS. 2A-2D schematically illustrate a bonding method according to various embodiments. FIG. 2A illustrates a schematic side sectional view of the first element 18 or the second element 20. The first or second element 18, 20 can comprise an integrated device die or a wafer. Although not shown in FIGS. 2A-2D, in some embodiments, the element in wafer form may be coated with a protective layer prior to singulation to protect the element during the singulation process. As explained above in connection with FIG. 1, after singulation, the protective layer can be removed with a suitable cleaning formulation, and the element can be ashed to remove debris. Thus, in FIG. 2A, the first or second element 18, 20 is shown without the protective layer.

The element 18, 20 can comprise a base portion 21, which can comprise a semiconductor material, such as a silicon device for example. Active devices (e.g., transistors) and/or passive devices can be formed in or on the base portion 21. A bonding layer 24 can be provided (e.g., deposited) on the base portion 21. In various embodiments, the bonding layer 24 can comprise a nonconductive bonding region 22 (e.g., a dielectric field region) that includes an inorganic dielectric in some embodiment. In other embodiments, the nonconductive bonding region 22 can comprise an organic dielectric. For example, in some embodiments, the nonconductive bonding region 22 can comprise silicon oxide or a silicon-containing dielectric layer such as SiN, $SiO_xN_y$, silicon carbide, silicon carbonitride or silicon carboboride, etc. The nonconductive bonding region 22 may also comprise non-silicon dielectric layer for example, ceramic layers, such as alumina or sapphire, zirconia, boron carbide, boron oxide, aluminum nitride, piezoceramics, ferro ceramics, zinc oxide, zirconium dioxide, titanium carbide, glass ceramics and their various combinations.

The bonding layer 24 can further include a plurality of conductive contact pads 23 formed in the nonconductive bonding region 22. In various embodiments, the contact pads 23 can comprise copper or copper alloy, or nickel or nickel alloys, although other suitable metals can be used. The bonding layer 24 can comprise a bonding surface that can be cleaned and polished or planarized (e.g., using chemical mechanical polishing, or CMP) to a very high degree of smoothness. Exposed surfaces (e.g., upper surfaces) of the contact pads 23 may be recessed relative to the exterior surface of the nonconductive bonding region 22. For example, the exposed surfaces can be recessed relative to the exterior surface of the nonconductive bonding region 22 by less than 20 nm, less than 15 nm, or less than 10 nm, for example, recessed in a range of 2 nm to 20 nm, or in a range of 4 nm to 10 nm.

Turning to FIG. 2B, the bonding layer 24 can be activated for direct bonding after the polishing. For example, the bonding layer 24 can be exposed to a plasma comprising an activation species A. In some embodiments, the plasma can comprise a nitrogen-containing species. For example, in embodiments in which the nonconductive bonding region 22 comprises silicon oxide or silicon carbonitride, the use of a nitrogen-containing plasma for activation can provide strong bonding energies. In other embodiments, the plasma can comprise an oxygen-containing plasma. For example, in embodiments in which the nonconductive bonding region 22 comprises silicon nitride or silicon carbonitride, the use of an oxygen-containing plasma for activation can provide strong bonding energies.

In FIG. 2C, a last chemical treatment T can be performed to react with the polished and activated bonding layer 24. The last chemical treatment T can comprise a liquid solution (e.g., an aqueous solution). For example, in some embodiments, a dispersion device 25, such as a sprayer, can be used to rinse the bonding layer 24 with a glass-forming chemical species S. The glass-forming species S can be selected to have a composition and/or concentration that does not etch the pads 23 (e.g., that does not significantly etch copper). In various embodiments, the glass-forming chemical species S can comprise a liquid solution that includes at least one of boron, phosphorus, manganese, arsenic, peroxide, selenium, carbon, and fluorine or a fluoride source. In some embodiments, the glass-forming chemical species S can include a liquid solution that includes only one of boron, phosphorus, manganese, arsenic, peroxide, selenium, carbon, and fluorine or a fluoride source. In other embodiments, the glass-forming chemical species S can include a liquid solution that includes more than one of boron, phosphorus, manganese, arsenic, peroxide, selenium, carbon, and fluorine or a fluoride source. In some embodiments, the glass-forming chemical species S can comprise very dilute buffered hydrofluoric acid (BHF) with a pH between 2 to 6.5, for example, in a range of 4 to 6.5. In some embodiments, the glass-forming (or glass-enhancing) chemical species S can comprise very dilute boric acid or selenious acid. In some embodiments, the glass-forming chemical species S can comprise hydrogen peroxide solution. The hydrogen peroxide solution may vary in a range of 0.3% to 50%, e.g., in a range of 1% to 15%. In some embodiments, the species S can comprise one or more of tetramethylammonium hydroxide ($C_4H_{12}N$), tert-butylammonium hydroxide, tetraethylammonium hydroxide, ethyltrimethylammonium hydroxide, boric anhydride, boric acid, borane-ammonia ($H_6BN$), borane trimethylamine complex, borane dimethyl amine complex ($C_2H_{10}BN$), tetrahydroxydiboron solution, mannitol ($C_6H_{14}O_6$, which can include multiple (6) hydroxyl groups), and ascorbic acid ($C_6H_8O_6$). After forming the glass enhancing layer over the bonding surface, the metal pad surface may be selectively cleaned prior to bonding. In some embodiments, the introduction of a peroxide-containing species at the bond interface can increase the bond energy of the bonded elements and also reduce voids at the bonding interface. In some embodiments, the glass-forming chemical species S can comprise dilute phosphoric acid. The concentration of the glass-forming species S can be very dilute so as to avoid overetching the conductive contact pads. For example, the glass-forming species S can be diluted in a solution (e.g., in an aqueous solution or a non-aqueous solution) to have a concentration in a range of 1 ppm to 10,000 ppm, in a range of 1 ppm to 1,000 ppm, in a range of 1 ppm to 500 ppm, in a range of 1 ppm to 400 ppm, in a range of 5 ppm to 10,000 ppm, in a range of 5 ppm to 4,000 ppm, or in a range of 5 ppm to 500 ppm. In various embodiments, the last chemical treatment can have a pH of at least 3.1, or of at least 3.3. For example, the last chemical treatment can have a pH in a range of 3.3 to 10, or in a range of 4 to 10.

In some embodiments, the glass-forming chemical species S can comprise tetramethyl ammonium hydroxide. The pH of the tetramethyl ammonium hydroxide can be in a range of 7 to 11, or in a range of 7 to 10. A concentration of the tetramethyl ammonium hydroxide can be less than 200 ppm, or less than 100 ppm. For example, a concentration of the tetramethyl ammonium hydroxide can be in a range of 5 ppm to 75 ppm, or in a range of 5 ppm to 60 ppm.

The last chemical treatment T of FIG. 2C can comprise a liquid treatment that chemically reacts with the bonding layer 24 and/or with the bonding layer 24 of the other element during bonding. In some embodiments, for example, the liquid treatment can react so as to reduce a size of voids at the bonding surface(s). For example, in conventional wafer to wafer (W2W) bonding operations, the planar bonding surface of the first and second elements 18, 20 may be cleaned with DIW or any suitable cleaning agent. The cleaned surfaces may be ashed and rinsed with DIW prior to the activation step. As explained above, the activation step may comprise exposing the bonding surfaces of the first and/or second elements 18, 20 to a nitrogen-containing plasma, a water vapor plasma, or various combinations of both types of plasma. After the activation process, the activated bonding surfaces can be thoroughly rinsed with DIW before bonding the wafers. In the disclosed embodiments, the last chemical treatment may not comprise pure water, e.g., pure DIW.

For example, in a wafer-to-wafer (W2W) bonding process of silicon dioxide planar bonding surfaces, the first and/or second elements 18, 20 may be cleaned with DIW or any suitable cleaning agent. The cleaned planar silicon oxide surfaces may be ashed (e.g., the ashing process may comprise the use of water vapor plasma as described herein) and, after the ashing step, the ashed surface of the first and/or second elements 18, 20 may be rinsed with DIW prior to the W2W bonding operation, which may be performed without the activation step. In some embodiments, after the ashing step, the ashed surface of the first and/or second elements may be exposed to the last chemical treatment T before the W2W bonding operation. The last chemical treatment T may comprise a glass-forming chemical species S, for example, very dilute tetramethyl ammonium hydroxide. The pH of the tetramethyl ammonium hydroxide can be in a range of 7 to 11, or in a range of 7 to 10 prior to the W2W bonding operation. As an example, the last chemical treatment T may comprise dipping the ashed surface of the first and/or second elements 18, 20 in the chemical species S, or the chemical species S may be sprayed or coated on the ashed surface with the dispersion device 25. For example, the chemical species S may be sprayed or coating for a time in a range of 5 s to 120 s before spin drying species S on the ashed surface or surfaces. Thus, the chemical species S can be applied by exposing the ashed surface to the chemical species S and drying the species S from the exposed surface without the use of any other cleaning agent. In one example, the measured bond energy of a bonded pair of planar silicon oxide surfaces that were ashed and rinsed with DIW and annealed at 150° C. for 15 minutes was between 500 mJ/m$^2$ to 700 mJ/m$^2$. By contrast, the measured bond energy of a bonded pair of planar silicon oxide surfaces that were ashed and exposed to a very dilute tetramethyl ammonium hydroxide prior to the annealing step was between 2200 mJ/m$^2$ to 2400 mJ/m$^2$, which provides a substantially stronger direct bond as compared to surfaces that are rinsed with DIW before bonding. In this example, the application of the last chemical treatment process to treat the ashed bonding surfaces of the first and/or second elements 18, 20 can improve the bond strength or bond energy of the bonded structure by a factor of at least 3. In some embodiments, the last chemical treatment may be applied to the activated surfaces of the first and/or second elements directly prior to the bonding step.

The last chemical treatment may comprise a chemically active species S that reacts with or adsorbs to the activated surface of the bonding layer (or with the bonding surface of the other element to which it is to be bonded) and provides a high bonding energy when broad into contact with the bonding surface of the other element. In various embodiments, no additional treatments are performed between the last chemical treatment and the direct bonding. For example, there may be no additional liquid treatments (e.g., no DIW or other pure water rinse) after the last chemical treatment.

In some embodiments, more than one type of chemical species S can be applied for the last chemical treatment for the cleaned, ashed, or activated surfaces of the first and/or second elements 18, 20. As an example, last chemical treatment applied to the cleaned bonding surface of the first element 18 can comprise chemical species A. For example, species A may render the bonding surface alkaline, as in a treatment with very dilute tetramethyl ammonium hydroxide. The last chemical treatment applied to the cleaned bonding surface of the second element 20 can comprise chemical species B. For example, species B may render the bonding surface acidic, as in a treatment with very buffered HF. After the treatment steps, the treated bonding surface of the first and second elements 18, 20 can be bonded and annealed at to increase the bond strength of the interface between the first and second bonded elements 18, 20. For element-to-element stacking operations, a bonding surface may be formed on the backside of the first or second element 18, 20. Forming the bonding surface on the backside of the second element 20, for example, may comprise thinning and polishing the second element 20 from the backside, forming a planar dielectric bonding surface with embedded conductive layer on the second element 20, ashing or activating the bonding surface on the backside of the second element 20, and performing the last chemical treatment prior to bonding a third element (not shown) on the backside of the second element 20. The stacked bonded elements may be annealed before subsequent operations. In one embodiment, the stacked bonded elements may not be annealed before subsequent processes, and the stacked bonded elements may be thoroughly rinsed before subsequent operations. One of the subsequent operations for example may comprise of singulating the bonded stacked elements or examples may include forming conductive structures on the lower or upper surface of the bonded stacked elements. The conductive structure may comprise a planar conductor or a flowable conductor or both.

Figure 2D:
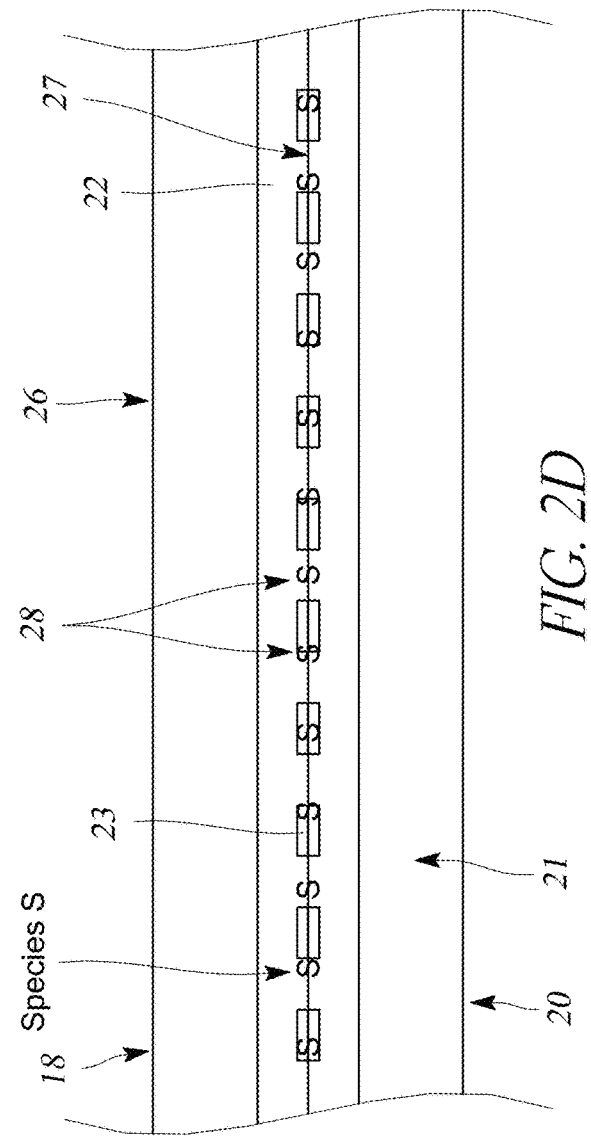

Turning to FIG. 2D, the first and second elements 18, 20 can be brought together in contact with one another to form a bonded structure 26 including direct bonds along a bond interface 27 between the nonconductive bonding regions 22 of the first and second elements 18, 20. The bonded structure 26 can be annealed, and the contact pads 23 can extend to make direct contact and an electrical connection along the bond interface 27. The bond interface 27 can comprise sediment from the last chemical treatment T. For example, as shown in FIG. 2D, sediment 28 of the glass-forming species S introduced in FIG. 2C may be present at the bond interface 27. For example, depending on the particular solution used in the last chemical treatment T, the glass-forming chemical species S at the bonding interface 27 can comprise at least one of boron, phosphorus, manganese, arsenic, peroxide, selenium, carbon, and fluorine or a fluoride source. In various embodiments, the bond interface 27 may additionally include a signature of the activation process A. For example, in some embodiments, the bond interface 27 may additionally include nitrogen and/or oxygen concentration peaks at or near the interface 27. The concentration of species S at the bonding interface 27 between the first and second elements 18, 20 can exceed the nominal background level of species S found at other dielectric-to-dielectric interfaces below or within the direct bonding layer.

Beneficially, the glass-forming species S can improve the bond energy between the bonded elements 18, 20 in the bonded structure 26 by reacting with the activated surface of the first and second elements 18, 20. As explained above, the glass-forming species S may be provided in a dilute concentration such that the conductive contact pads 23 are not overetched, which can improve the bonding and electrical connection between bonded pads 23. Overetching can increase the amount of the recess between the exposed upper surface of the pads 23 and the exterior surface of the nonconductive bonding region 22, which can reduce the reliability of the electrical connection. The glass-forming species S may also suppress oxide formation on the conductive contact pads 23. Moreover, the bonding wave can be slowed relative to the arrangement of FIG. 1, such that there are fewer voids and/or defects along the bond interface 27.

As explained herein, the first and second elements 18, 20 can be directly bonded to one another without an adhesive, which is different from a deposition process. The bond interface 27 between first and second elements 18, 20 can accordingly comprise a non-deposited interface. Further, directly bonded structures 26, unlike deposited layers, can include a defect region along the bond interface 27 in which nanovoids are present. The nanovoids may be formed due to activation of the bonding surfaces (e.g., exposure to a plasma). As explained above, the bond interface 27 can include a higher concentration of treatment element from the activation A and/or last chemical treatment processes T relative to deeper locations in the bonding layers 24 (typically inorganic dielectrics). For example, in embodiments that utilize a nitrogen plasma and/or ammonium dip for activation, a nitrogen peak can be formed at the bond interface 27 for silicon oxide-based bonding layers, relative to the bulk of the bonding layers 24. Nitrogen activation can also leave an oxygen peak at the interface surfaces of silicon nitride and silicon carbonitride bonding layers, relative to the bulk. In embodiments that utilize an oxygen plasma for activation, an oxygen peak can be formed at the bond interface 27. In some embodiments, the bond interface 27 can comprise silicon oxynitride, silicon oxycarbonitride, or silicon carbonitride. As explained herein, the direct bond can comprise a covalent bond, which is stronger than van Der Waals bonds. The bonding layers 24 can also comprise polished surfaces that are planarized to a high degree of smoothness.

In addition to N or O peaks from activation, in embodiments described herein, residue from the glass-forming species S may also be at the interface 27. For example, the interface 27 may include at least one of boron, phosphorus, manganese, arsenic, peroxide, selenium, carbon, and fluorine or a fluoride source.

In various embodiments, the metal-to-metal bonds between the contact pads 23 can be joined such that copper grains grow into each other across the bond interface 27. In some embodiments, the copper can have grains oriented along the 111 crystal plane for improved copper diffusion across the bond interface. The bond interface 27 can extend substantially entirely to at least a portion of the bonded contact pads 23, such that there is substantially no gap between the nonconductive bonding regions 22 at or near the bonded contact pads 23. In some embodiments, a barrier layer (not shown) may be provided under the contact pads (e.g., which may include copper). In other embodiments, however, there may be no barrier layer under the contact pads 23, for example, as described in US 2019/0096741, which is incorporated by reference herein in its entirety and for all purposes.

Figure 3:
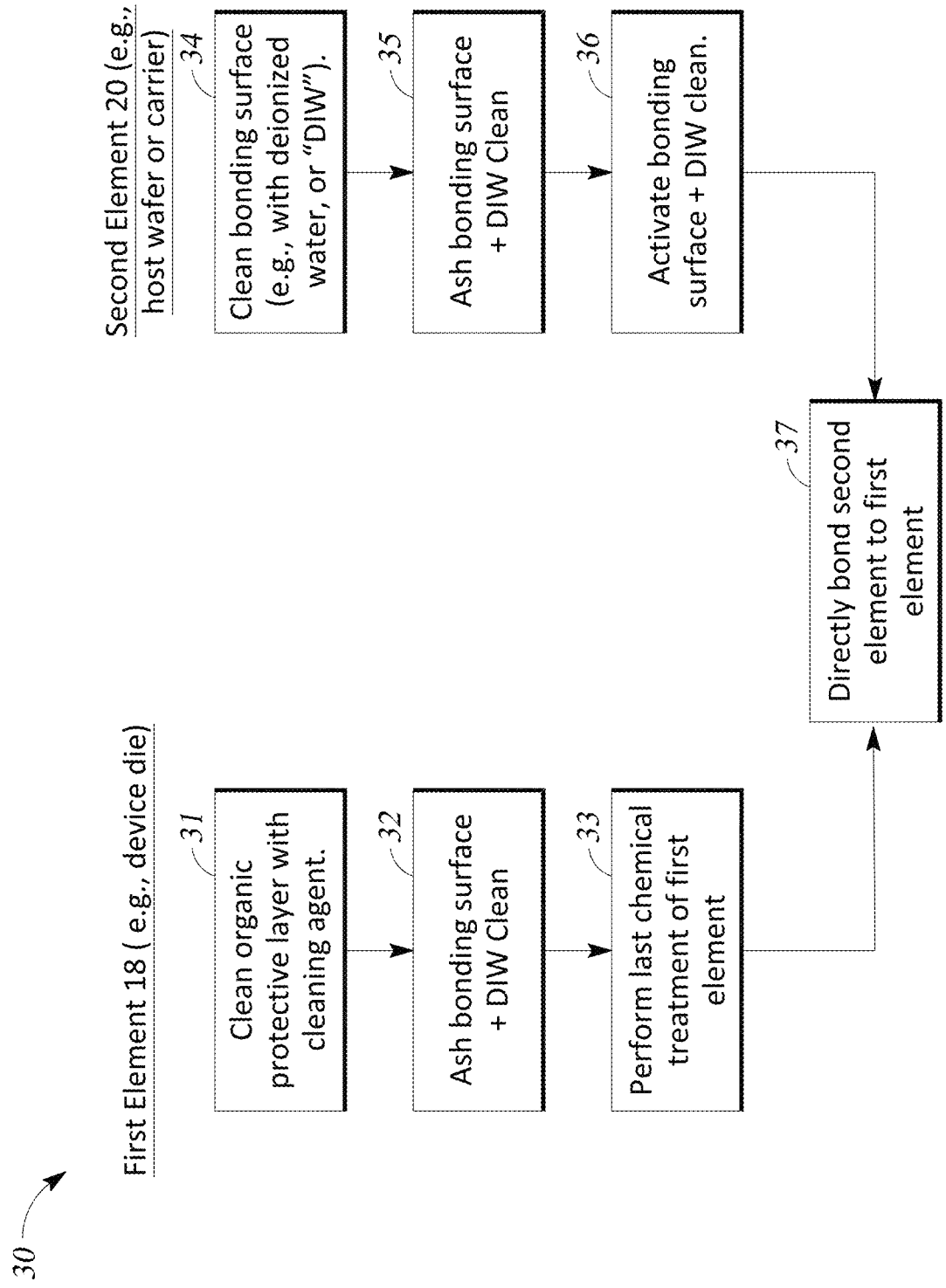
FIG. 3 is a flowchart illustrating an example process for forming a bonded structure, according to various embodiments.

FIG. 3 is a flowchart illustrating an example process 30 for forming a bonded structure 26. In FIG. 3, the last chemical treatment is performed on the first element 28 after ashing, but is not performed on the second element 20. Rather, the second element 20, which can comprise a host wafer or carrier, can be activated and rinsed with DIW without being exposed to a last chemical treatment. Sufficiently strong direct bonding can occur when only the second element 20 is activated and when only the first element 18 is subjected to the last chemical treatment T. The elements 18, 20 can be directly bonded without an intervening liquid treatment being applied to the first element 18 between the last chemical treatment and the direct bonding.

In FIG. 3, a suitable protective material, for example an organic protective layer (e.g., a photoresist), can be formed on the bonding surface of the first element, which can comprise a wafer. After providing the protective layer, the first element 18 may be mounted on a dicing sheet or dicing layer for a die singulation operation. The first element 18 with protective layer can be singulated along saw streets to form a plurality of singulated elements 18. In other applications, the first element 18 may be mounted on the dicing layer prior the application of the protective layer. In this example, the protective layer may be disposed on portions of the dicing sheet. Beneficially, the protective layer can protect the activated bonding surface from debris or damage during the singulation process (and other processes). As shown in block 31 of FIG. 3, the protective layer can be removed with a cleaning agent. In some embodiments, the cleaned singulated elements 18 may be further ashed (e.g., exposed to an oxygen plasma) in a block 32 to remove any unwanted residues prior to performing the last chemical treatment T on the bonding surface of the singulated dies. In a block 33, the last chemical treatment T can be applied to the ashed bonding surface of the first element 18, as explained above in connection with FIGS. 2A-2D. The last chemical treatment T of block 33 can utilize any of the gas-containing species S explained above.

Similarly, the bonding surface of the second element 20 may be cleaned in block 34 and ashed in block 35 to remove unwanted residues on the bonding surface. In some embodiments, as shown in block 36, the bonding surface of the second element 20 may be activated and rinsed with DIW prior to the bonding operation. In block 37, the first and second elements can be directly bonded without an intervening adhesive as explained above.

In the example of FIG. 3, only the singulated bonding surface of the first element 18 is exposed to the last chemical treatment T, while the second element 20 can be rinsed with DIW and may not undergo the last chemical treatment T between the activation of block 36 and the bonding of block 37. In other implementations, the bonding surfaces of the first singulated element 18 and the bonding surface of the second singulated element 20 can both be exposed to the last chemical treatment T before the bonding operation of block 37 as shown below in FIG. 5. Also, in some embodiments, although not illustrated in FIG. 3, the bonding surface of the first singulated element 18 may be activated prior to the last chemical treatment T of block 33. Accordingly, in some embodiments, only the second element 20 is activated prior to bonding, while in other embodiments, both the first and second elements 18, 20 may be activated prior to bonding. In still other embodiments, only the first element 18 may be activated prior to the bonding.

As described herein, the bonding surface of the first singulated element 18 may be treated with a last chemical species A and the bonding surface of the second singulated element 20 can be treated with a last chemical species B prior to the bonding operation of step 37. In this example, species A is a different chemical moiety from species B. As an example, species A may be acidic (e.g., mildly acidic) and species B may be alkaline (e.g., mildly alkaline). Species A may comprise more than one chemical moeity, and species B may comprise more than one chemical moeity. For example, species A may comprise a blend of very dilute buffer HF and very dilute phosphoric acid or very dilute boric acid, while species B may comprise a blend of very dilute tetramethyl ammonium hydroxide with very dilute dimethylamine borane. In some embodiments, the last chemical treatment T can apply species A (which can include one or multiple components) on the first element 18, and the second element 20 may not undergo the last chemical treatment, or vice versa. In some embodiments, the last chemical treatment T can apply species B (which can include one or multiple components) on the first element 18, and the second element 20 may not undergo the last chemical treatment T, or vice versa. Still other combinations may be suitable. The last chemical treatment T may be selected such that it does not substantially roughen the smooth bonding surface of the dielectric layer and does not substantially etch the pad metal to form an excessive recess over the pad metal. As explained above, an excessive pad recess can form a recess that is too deep such that pad-to-pad bonding may not form at the appropriate annealing conditions (e.g., annealing temperature and times). Thus, the appropriate chemical moieties may be selected for the formulation of the last treatment chemicals or chemistries.

After the bonding operation, the bonded elements may be annealed at a higher temperature to increase the bond strength of the interface between the first and second elements.

Figure 4:
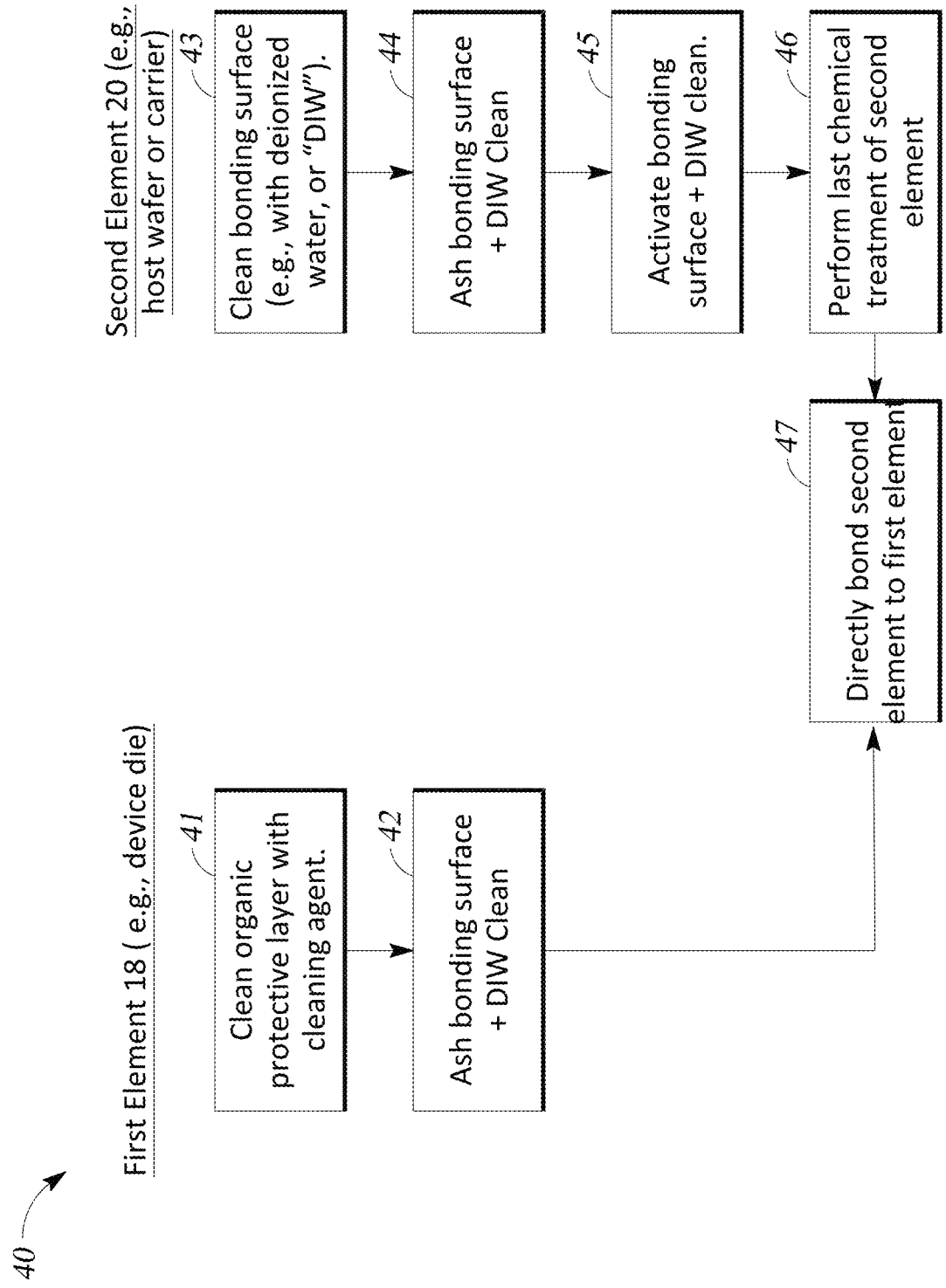
FIG. 4 is a flowchart illustrating another example process flow for forming a bonded structure, according to various embodiments.

FIG. 4 is a flowchart illustrating another example method 40 for forming a bonded structure 26. Unless otherwise noted, the steps of the method 40 of FIG. 4 may be generally similar to those set forth about in connection with FIGS. 2A-3. For example, the protective layer of first element 18 can be cleaned with a cleaning agent in a block 41, and ashed (and DIW cleaned) in a block 42. The bonding surface of the second element 20 can be cleaned in a block 43 and ashed (and DIW cleaned) in a block 44. The bonding surface of the second element 20 can be activated in a block 45. The last chemical treatment T can be performed on the activated bonding surface of the second element 20. In FIG. 4, the first element 18 may not be activated or exposed to the last chemical treatment before direct bonding in a block 47. Rather, the bonding layer of the second element 20 can be activated and, subsequently, the activated bonding surface of the second element 20 can be exposed to the last chemical treatment before direct bonding in block 47.

Figure 5:
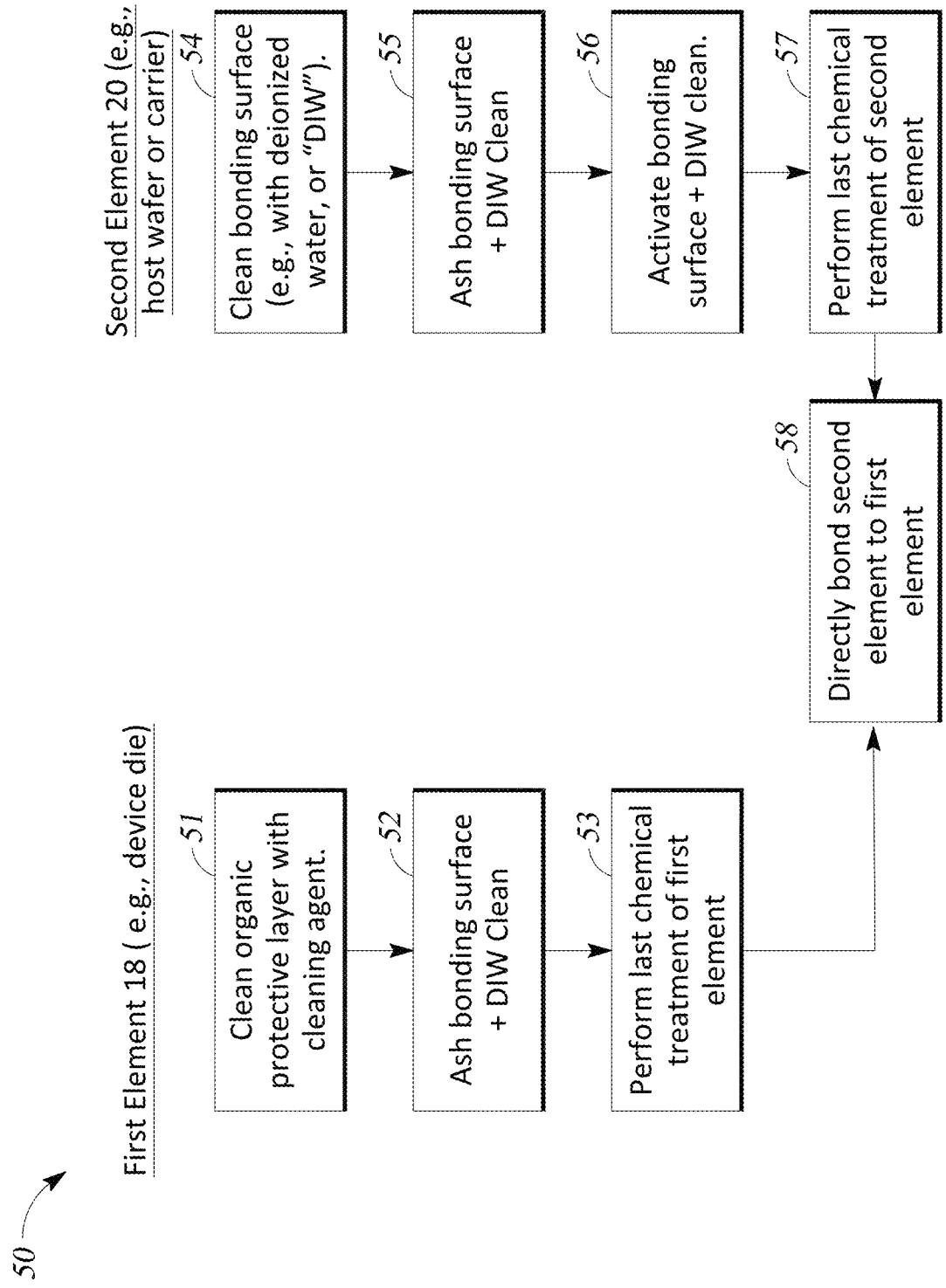
FIG. 5 is a flowchart illustrating another example process flow for forming a bonded structure, according to various embodiments.

FIG. 5 is a flowchart illustrating another example method 50 for forming a bonded structure 26. Unless otherwise noted, the steps of the method 50 of FIG. 5 may be generally similar to those set forth about in connection with FIGS. 2A-4. For example, the protective layer of first element 18 can be cleaned with a cleaning agent in a block 51, and ashed (and DIW cleaned) in a block 52. In block 53 of FIG. 5, the first element 18 may not be activated but may be exposed to the last chemical treatment after ashing of block 52. The bonding surface of the second element 20 can be cleaned in a block 54 and ashed (and DIW cleaned) in a block 55. The second element 20 can be activated in a block 56, and, subsequently the last chemical treatment T can be performed in a block 57 before direct bonding in a block 58. After exposing the first and second elements 18, 20 to the last chemical treatments T, the first and second elements 18, 20 can be directly bonded in block 58 without an intervening liquid treatment between the last chemical treatments of blocks 53, 57 and the direct bonding of block 58.

Figure 6:
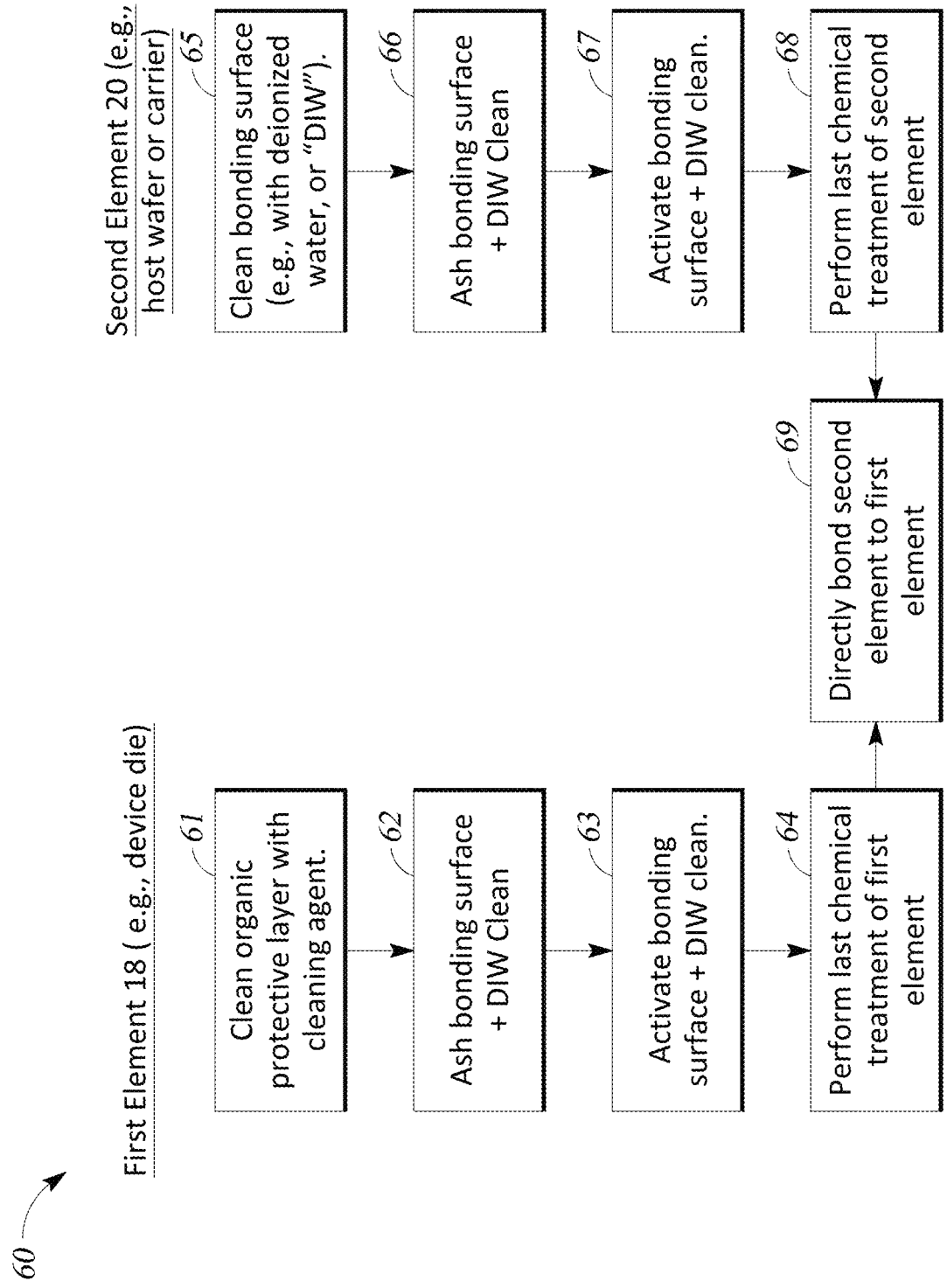
FIG. 6 is a flowchart illustrating another example process flow for forming a bonded structure, according to various embodiments.

FIG. 6 is a flowchart illustrating another example process 60 for forming a bonded structure 26. Unless otherwise noted, the steps of the method 60 of FIG. 6 may be generally similar to those set forth about in connection with FIGS. 2A-5. For example, the protective layer of first element 18 can be cleaned with a cleaning agent in a block 61, and ashed (and DIW cleaned) in a block 62. In the embodiment of FIG. 6, both the bonding layers of the first and second elements 18, 20 can be activated and, subsequently, the activated surfaces of the first and second elements can be exposed to respective last chemical treatments T. For example, the bonding surface of the first element 18 can be activated (and DIW cleaned) in a block 63, and the activated bonding surface of the first element 18 can be exposed to the last chemical treatment T in a block 64. The bonding surface of the second element 20 can be cleaned in a block 65 and ashed (and DIW cleaned) in a block 66. The second element 20 can be activated in a block 67, and, subsequently the last chemical treatment T can be performed in a block 68 to the second element 20. The first and second elements 18, 20 can be directly bonded in a block 69 without an intervening liquid treatment between the last chemical treatments of blocks 64, 68 and the direct bonding of block 69.

Figure 7:
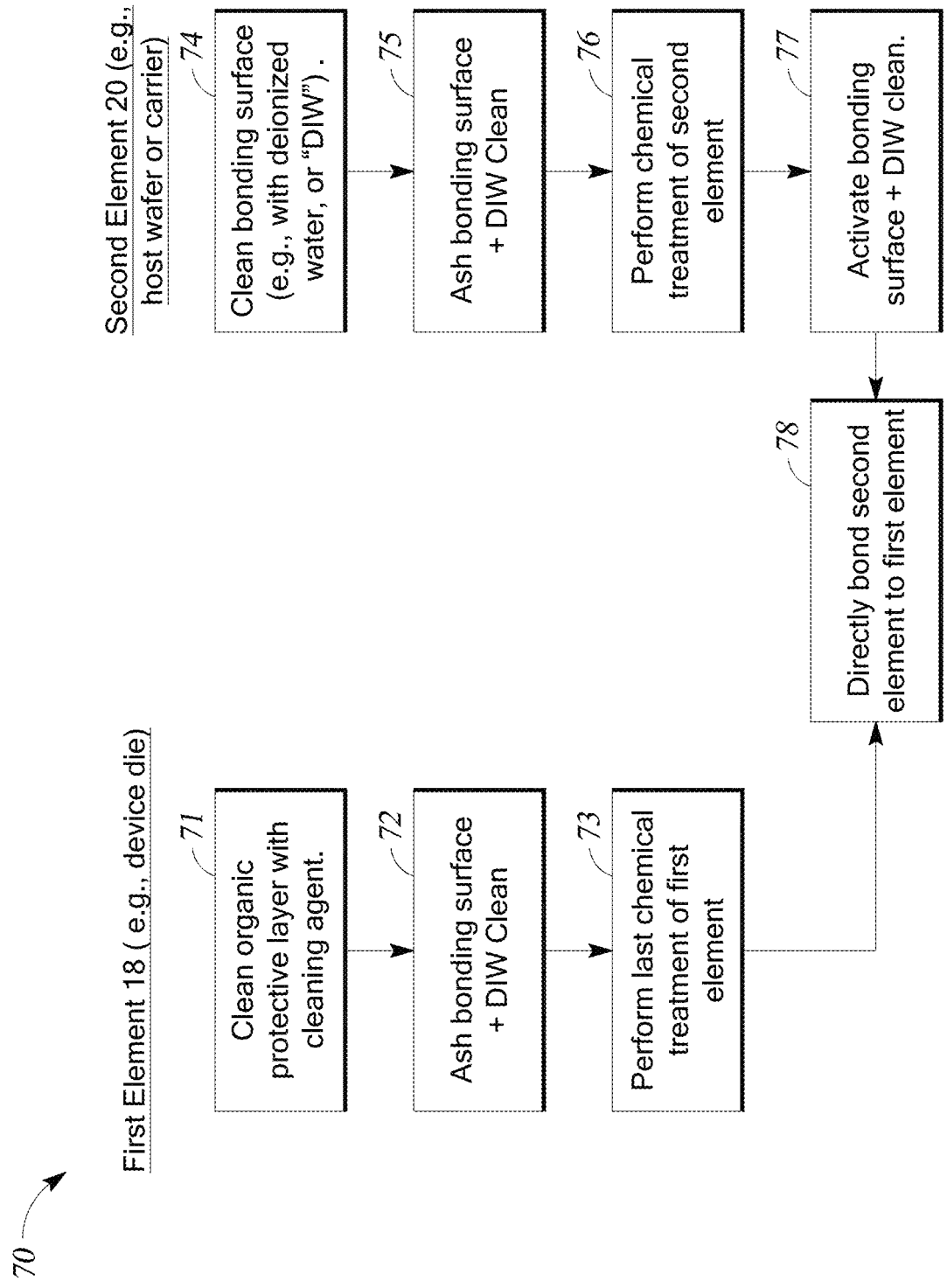
FIG. 7 is a flowchart illustrating another example process flow for forming a bonded structure, according to various embodiments.

FIG. 7 is a flowchart illustrating another example process 70 for forming a bonded structure 26. Unless otherwise noted, the steps of the method 70 of FIG. 7 may be generally similar to those set forth about in connection with FIGS. 2A-6. For example, the protective layer of first element 18 can be cleaned with a cleaning agent in a block 71, and ashed (and DIW cleaned) in a block 72. In block 73 of FIG. 7, the first element 18 can be exposed to the last chemical treatment T after ashing and before directly bonding without an intervening treatment (e.g., without an intervening liquid treatment).

The bonding surface of the second element 20 can be cleaned in a block 74 and ashed (and DIW cleaned) in a block 75. In a block 76, the bonding layer of the second element 20 can be exposed to a chemical treatment after the ashing of block 75. The chemical treatment of block 76 may be similar to the last chemical treatment described above in connection with FIGS. 2A-6, except, in a block 77, the bonding layer of the second element 20 can be activated after the chemical treatment of block 76. Thus, in the embodiment of FIG. 7, the bonding surface of the second element 20 can be exposed to the glass-forming species S described above in the chemical treatment of block 76 before activation. The first and second elements can be directly bonded in a block 78.

After the treatment steps, the treated bonding surface of the first and second elements 18, 20 can be directly bonded and annealed at higher temperature to increase the bond strength of the interface 27 between the bonded elements 18, 20. For die to die (D2D) or element-to-element stacking operations, an additional die may be bonded on a bonding surface formed on the backside of the first or second elements 18, 20. Bonding a third element (not shown) on the back surface of the first element 18 may comprise cleaning the backside of the first element 18, ashing or activating the bonding surface on the backside of the first element 18, and performing the last chemical treatment on the bonding surface of the singulated third element or the backside of the first element 18 (or to both surfaces), prior to bonding the third element on the backside of the first element 18. The stacked bonded elements may be annealed at higher temperature before subsequent operations. In one embodiment, the stacked bonded elements may not be annealed before subsequent process, and the stacked bonded elements may be thoroughly rinsed before subsequent operations.

As explained above, one of the subsequent operations for example may comprise of singulating the second element with stacked element or elements to form directly bonded stacked elements. Other subsequent operations may include forming conductive structures on the lower or upper surface of the bonded stacked elements. The conductive structure may comprise a planar conductor or a flowable conductor or both.

In one embodiment, a bonding method can include: polishing a first bonding layer of a first element for direct bonding, the first bonding layer comprises a first conductive pad and a first non-conductive bonding region; after the polishing, performing a last chemical treatment of the polished first bonding layer; and after performing the last chemical treatment, directly bonding the first bonding layer of the first element to a second bonding layer of a second element without an intervening adhesive, including directly bonding the first conductive pad to a second conductive pad of the second bonding layer and directly bonding the first non-conductive bonding region to a second nonconductive bonding region of the second bonding layer, wherein no treatment or rinse is performed on the first bonding layer between performing the last chemical treatment and directly bonding.

In some embodiments, the method can include activating the first bonding layer for direct bonding. In some embodiments, the activating is performed before performing the last chemical treatment. In some embodiments, activating comprises exposing the first bonding layer to a plasma. In some embodiments, activating comprises exposing the first bonding layer to a nitrogen-containing plasma. In some embodiments, the first bonding layer comprises silicon oxide or silicon carbonitride. In some embodiments, activating comprises exposing the first bonding layer to an oxygen-containing plasma. In some embodiments, the first bonding layer comprises silicon nitride or silicon carbonitride. In some embodiments, performing the last chemical treatment comprises exposing the first bonding layer to a chemical species comprising at least one of boron, phosphorus, manganese, arsenic, peroxide, selenium, carbon, and fluorine or fluoride source. In some embodiments, a concentration of the chemical species is in a range of 1 ppm to 1,000 ppm. In some embodiments, a concentration of the chemical species is in a range of 1 ppm to 500 ppm. In some embodiments, performing the last chemical treatment comprises exposing the first bonding layer to a source of boron. In some embodiments, performing the last chemical treatment comprises exposing the first bonding layer to very dilute borane dimethylamine (BDMA). In some embodiments, a concentration of the BDMA is in a range of 5 ppm to 10,000 ppm. In some embodiments, performing the last chemical treatment comprises exposing the first bonding layer to boric acid. In some embodiments, performing the last chemical treatment comprises exposing the first bonding layer to very dilute phosphoric acid. In some embodiments, a concentration of the phosphoric acid is in a range of 5 ppm to 10,000 ppm. In some embodiments, performing the last chemical treatment comprises exposing the first bonding layer to a chemical treatment comprising very dilute buffered hydrofluoric acid (BHF). In some embodiments, a pH of the BHF is in a range of 4 to 6.5. In some embodiments, the last chemical treatment has a pH of at least 3.1. In some embodiments, the last chemical treatment has a pH of at least 3.3. In some embodiments, the last chemical treatment has a pH in a range of 3.3 to 9.5. In some embodiments, the last chemical treatment has a pH in a range of 3.3 to 4. In some embodiments, performing the last chemical treatment comprises exposing the first bonding layer to a chemical treatment comprising tetramethyl ammonium hydroxide. In some embodiments, the last chemical treatment has a pH in a range of 7 to 11. In some embodiments, the last chemical treatment has a pH in a range of 7 to 9.8. In some embodiments, a concentration of the tetramethyl ammonium hydroxide is less than 55 ppm. In some embodiments, the concentration of the tetramethyl ammonium hydroxide is less than 48 ppm. In some embodiments, a concentration of the tetramethyl ammonium hydroxide is in a range of 5 ppm to 45 ppm. In some embodiments, a concentration of the tetramethyl ammonium hydroxide is in a range of 5 ppm to 35 ppm. In some embodiments, performing the last chemical treatment comprises exposing the first bonding layer to a chemical treatment comprising one or more of tetramethylammonium hydroxide ($C_4H_{12}N$), tert-butylammonium hydroxide, tetraethylammonium hydroxide, ethyltrimethylammonium hydroxide, boric anhydride, boric acid, borane-ammonia ($H_6BN$), borane trimethylamine complex, borane dimethyl amine complex ($C_2H_{10}BN$), tetrahydroxydiboron solution, mannitol ($C_6H_{14}O_6$), and ascorbic acid ($C_6H_8O_6$). In some embodiments, the first bonding layer comprises a first plurality of conductive contact pads including the first conductive contact pad, wherein the second bonding layer comprises a second plurality of conductive contact pads including the second conductive contact pad, and wherein directly bonding comprises directly bonding the first and second pluralities of conductive contact pads to one another without an adhesive. In some embodiments, the method can include activating the second bonding layer before directly bonding. In some embodiments, the method can, after the activating the second bonding layer, performing a last chemical treatment of the second bonding layer. In some embodiments, the directly bonding is performed without activating the second bonding layer. In some embodiments, the first element comprises a wafer, the method further comprising providing a protective layer over the first bonding layer and singulating the wafer into a plurality of singulated integrated device dies. In some embodiments, the method can include removing the protective layer before performing the last chemical treatment.

In another embodiment, a bonding method can include: polishing a first bonding layer of a first element for direct bonding; after the polishing, performing a last treatment of the polished first bonding layer, the last treatment comprising a solution including at least one of boron, phosphorus, manganese, selenium, carbon, a peroxide and arsenic; and after performing the last treatment, directly bonding the first bonding layer of the first element to a second bonding layer of a second element without an intervening adhesive.

In some embodiments, no liquid treatment is performed on the first bonding layer between performing the last chemical treatment and directly bonding. In some embodiments, the last chemical treatment comprises a glass-forming species having a concentration in a range of 5 ppm to 10,000 ppm.

In another embodiment, a bonding method can include: activating a first bonding layer of a first element for direct bonding; after the activating, performing a last treatment of the activated first bonding layer to the polished first bonding layer; and after performing the last treatment, directly bonding a first nonconductive region of the first bonding layer of the first element to a second nonconductive region of a second bonding layer of a second element without an intervening adhesive and directly bonding a first contact pad of the first bonding layer to a second contact pad of the second bonding layer without an intervening adhesive.

In some embodiments, no liquid treatment is performed on the first bonding layer between performing the last chemical treatment and directly bonding. In some embodiments, no chemical treatment is performed on the first bonding layer between performing the last chemical treatment and directly bonding. In some embodiments, a method can include a bonded structure formed by the bonding methods described herein. In some embodiments, the first and second elements are directly bonded along a bonding interface, the bonding interface comprising sediment from the last chemical treatment. In some embodiments, the sediment comprises at least a local peak concentration of a dilute chemical used in the chemical treatment. In some embodiments, the sediment comprises at least one of boron, phosphorus, manganese, arsenic and fluorine.

In another embodiment, a bonding method can include: forming a bonding surface on a first element; coating the bonding surface of the first element with a protective layer; singulating the first element and the protective layer on a dicing sheet; cleaning the protective layer from the bonding surface of the first element while the first element is still mounted on the dicing sheet; exposing the cleaned surfaces of the singulated first elements to plasma; performing a last chemical treatment of the polished first bonding layer; and after performing the last chemical treatment, directly bonding the first bonding layer of the first element to a second bonding layer of a second element without an intervening adhesive, wherein no deionized water (DIW) rinse is performed on the first bonding layer between performing the last chemical treatment and directly bonding.

In some embodiments, the last chemical treatment does not degrade the bonding surface of the first element. In some embodiments, the plasma comprises oxygen plasma, water vapor plasma, or nitrogen plasma. In some embodiments, the plasma treated bonding surface area of the first element is rinsed with DIW before bonding operation. In some embodiments, the bonding surface of the first element is rinsed with DIW before performing the last chemical treatment. In some embodiments, the method can include exposing the bonding surface of the second element to plasma before bonding, wherein the plasma comprises oxygen plasma, water vapor plasma, or nitrogen plasma. In some embodiments, the bonding surface area of the first element is smaller than that of the second element. In some embodiments, the method can include annealing the bonded structure at a temperature higher than room temperature.

In another embodiment, a bonding method can include: forming a bonding surface on a first element; forming a bonding surface on a second element; exposing the bonding surfaces of at least one of the first and second elements to a plasma; performing a first last chemical treatment on the bonding surface of the first element; performing a second last chemical treatment on the bonding surface of the second element; directly bonding respective nonconductive regions of the first and second elements without an intervening adhesive; and directly bonding respective conductive pads of the first and second elements without an intervening adhesive.

In some embodiments, the first chemical treatment is different from the second chemical treatment. In some embodiments, the method can include annealing the bonded structure at a temperature higher than room temperature. In some embodiments, the first last chemical treatment comprises an acidic chemical species and the second last chemical treatment comprises an alkaline chemical species. In some embodiments, the second element is larger than the first element, the method further comprising singulating the larger second element to form bonded plurality of elements.

In another embodiment, a bonded structure can include: a first element having a first contact pad at least partially embedded in a first nonconductive region; and a second element at least partially embedded in a second nonconductive region, the first and second elements directly bonded to one another along a bond interface, the first and second nonconductive regions directly bonded without an adhesive, the first and second contact pads directly bonded without an adhesive, wherein the bond interface comprises sediment from a last chemical treatment to at least one of the first and second nonconductive regions.

In some embodiments, the sediment comprises at least a local peak concentration of a dilute chemical used in the last chemical treatment. In some embodiments, the sediment comprises at least one of boron, phosphorus, manganese, arsenic, selenium, and fluorine. In some embodiments, the sediment comprises carbon.

All of these embodiments are intended to be within the scope of this disclosure. These and other embodiments will become readily apparent to those skilled in the art from the following detailed description of the embodiments having reference to the attached figures, the claims not being limited to any particular embodiment(s) disclosed. Although this certain embodiments and examples have been disclosed herein, it will be understood by those skilled in the art that the disclosed implementations extend beyond the specifically disclosed embodiments to other alternative embodiments and/or uses and obvious modifications and equivalents thereof. In addition, while several variations have been shown and described in detail, other modifications will be readily apparent to those of skill in the art based upon this disclosure. It is also contemplated that various combinations or sub-combinations of the specific features and aspects of the embodiments may be made and still fall within the scope. It should be understood that various features and aspects of the disclosed embodiments can be combined with, or substituted for, one another in order to form varying modes of the disclosed implementations. Thus, it is intended that the scope of the subject matter herein disclosed should not be limited by the particular disclosed embodiments described above, but should be determined only by a fair reading of the claims that follow.

What is claimed is:

1. A bonding method comprising:
   polishing a first bonding layer of a first element for direct bonding, the first bonding layer comprises a first conductive pad and a first non-conductive bonding region;
   after the polishing, performing a last chemical treatment of the polished first bonding layer; and
   after performing the last chemical treatment, directly bonding the first bonding layer of the first element to a second bonding layer of a second element without an intervening adhesive, including directly bonding the first conductive pad to a second conductive pad of the second bonding layer and directly bonding the first non-conductive bonding region to a second nonconductive bonding region of the second bonding layer, wherein no treatment or rinse is performed on the first bonding layer between performing the last chemical treatment and directly bonding.

2. The bonding method of claim 1, further comprising activating the first bonding layer for direct bonding.

3. The bonding method of claim 2, wherein the activating is performed before performing the last chemical treatment.

4. The bonding method of claim 2, wherein activating comprises exposing the first bonding layer to a plasma.

5. The bonding method of claim 4, wherein activating comprises exposing the first bonding layer to a nitrogen-containing plasma.

6. The bonding method of claim 1, wherein performing the last chemical treatment comprises exposing the first bonding layer to a chemical species comprising at least one of boron, phosphorus, manganese, arsenic, peroxide, selenium, carbon, and fluorine or fluoride source.

7. The bonding method of claim 6, wherein a concentration of the chemical species is in a range of 1 ppm to 1,000 ppm.

8. The bonding method of claim 6, wherein performing the last chemical treatment comprises exposing the first bonding layer to a source of boron.

9. The bonding method of claim 7, wherein performing the last chemical treatment comprises exposing the first bonding layer to very dilute borane dimethylamine (BDMA).

10. The bonding method of claim 7, wherein performing the last chemical treatment comprises exposing the first bonding layer to boric acid.

11. The bonding method of claim 6, wherein performing the last chemical treatment comprises exposing the first bonding layer to very dilute phosphoric acid.

12. The bonding method of claim 6, wherein performing the last chemical treatment comprises exposing the first bonding layer to a chemical treatment comprising very dilute buffered hydrofluoric acid (BHF).

13. The bonding method of claim 12, wherein a pH of the BHF is in a range of 4 to 6.5.

14. The bonding method of claim 1, wherein performing the last chemical treatment comprises exposing the first bonding layer to a chemical treatment comprising tetramethyl ammonium hydroxide.

15. The bonding method of claim 14, wherein the last chemical treatment has a pH in a range of 7 to 11.

16. The bonding method of claim 14, wherein a concentration of the tetramethyl ammonium hydroxide is less than 55 ppm.

17. The bonding method of claim 1, wherein performing the last chemical treatment comprises exposing the first bonding layer to a chemical treatment comprising one or more of tetramethyl ammonium hydroxide (C4H12N), tert-butylammonium hydroxide, tetraethylammonium hydroxide, ethyltrimethylammonium hydroxide, boric anhydride, boric acid, borane-ammonia (H6BN), borane trimethylamine complex, borane dimethyl amine complex (C2H10BN), tetrahydroxydiboron solution, mannitol (C6H14O6), and ascorbic acid (C6H8O6).

18. The bonding method of claim 1, further comprising activating the second bonding layer before directly bonding.

19. The bonding method of claim 18, further comprising, after the activating the second bonding layer, performing a last chemical treatment of the second bonding layer.

20. The bonding method of claim 1, wherein the directly bonding is performed without activating the second bonding layer.

21. The bonding method of claim 1, wherein the first element comprises a wafer, the method further comprising providing a protective layer over the first bonding layer and singulating the wafer into a plurality of singulated integrated device dies.

22. A bonded structure formed by the bonding method of claim 1, wherein the first and second elements are directly bonded along a bonding interface, the bonding interface comprising sediment from the last chemical treatment.

23. The bonding method of claim 1, wherein the last chemical treatment comprises a chemically active species that reacts with or adsorbs to a polished surface of the polished first bonding layer.

24. The bonding method of claim 1, wherein the last chemical treatment does not comprise pure water.

25. A bonding method comprising:
polishing a first bonding layer of a first element for direct bonding;
after the polishing, performing a last chemical treatment of the polished first bonding layer, the last treatment comprising tetramethyl ammonium hydroxide; and
after performing the last chemical treatment, directly bonding the first bonding layer of the first element to a second bonding layer of a second element without an intervening adhesive.

26. The bonding method of claim 25, wherein no liquid treatment is performed on the first bonding layer between performing the last chemical treatment and directly bonding.

27. The bonding method of claim 25, wherein the last chemical treatment comprises a glass-forming species having a concentration of less than 200 ppm.

28. A bonding method comprising:
activating a first bonding layer of a first element for direct bonding;
after the activating, performing a last chemical treatment of the activated first bonding layer; and
after performing the last treatment, directly bonding a first nonconductive region of the first bonding layer of the first element to a second nonconductive region of a second bonding layer of a second element without an intervening adhesive and directly bonding a first contact pad of the first bonding layer to a second contact pad of the second bonding layer without an intervening adhesive, wherein no treatment or rinse is performed on the first bonding layer between performing the last chemical treatment and directly bonding.

29. The bonding method of claim 28, wherein no liquid treatment is performed on the first bonding layer between performing the last chemical treatment and directly bonding.

30. The bonding method of claim 28, wherein no chemical treatment is performed on the first bonding layer between performing the last chemical treatment and directly bonding.

31. The bonded structure of claim 22, wherein the sediment comprises at least a local peak concentration of a dilute chemical used in the chemical treatment.

32. The bonding method of claim 28, wherein the last chemical treatment comprises a chemically active species that reacts with or adsorbs to an activated surface of the activated first bonding layer.

33. The bonding method of claim 28, wherein the last chemical treatment does not comprise pure water.

* * * * *